(12) United States Patent
Iwasaki et al.

(10) Patent No.: US 7,431,996 B2
(45) Date of Patent: Oct. 7, 2008

(54) POLYESTER RESIN, FUNCTIONAL DEVICE AND ORGANIC ELECTROLUMINESCENT DEVICE USING POLYESTER RESIN, AND METHOD OF MANUFACTURING ORGANIC ELECTROLUMINESCENT DEVICE

(75) Inventors: Masahiro Iwasaki, Minamiashigara (JP); Katsumi Nukada, Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 17 days.

(21) Appl. No.: 10/631,716

(22) Filed: Aug. 1, 2003

(65) Prior Publication Data

US 2004/0126616 A1 Jul. 1, 2004

(30) Foreign Application Priority Data

Dec. 17, 2002 (JP) ............................. 2002-365413

(51) Int. Cl.
| H01L 51/00 | (2006.01) |
| H01J 1/62 | (2006.01) |
| C08G 63/02 | (2006.01) |
| C09K 11/06 | (2006.01) |

(52) U.S. Cl. ................. 428/690; 428/917; 313/504; 313/506; 257/40; 528/272; 528/423

(58) Field of Classification Search ................. 428/690, 428/917; 528/272, 423; 257/40; 313/504, 313/506

See application file for complete search history.

(56) References Cited

U.S. PATENT DOCUMENTS 6,887,591 B2 * 5/2005 Nukada et al. .............. 428/690

FOREIGN PATENT DOCUMENTS

| JP | 55-075424 | 6/1980 |
| JP | 10-001665 | * 1/1998 |
| WO | WO 00/068291 | 11/2000 |

OTHER PUBLICATIONS

Peng et al., Novel oxadiazole-containing conjugated polymers as efficient single layer light-emitting diodes, Synthetic Metals, 105, (1999) pp. 73-78.*
Holzer et al, Amplified spontaneous emission in neat films of arylene-vinylene polymers, Optical and Quantum Electronics, 33 121-150, 2001.*
Polymethacrylates with Pendant Oxadiazole Units Synthesis and Application in Organic LEDs, Greczmiel et al., Macromolecules 1997, 30, pp. 6042-6046.*
de Morais et al., Hybrid Organic-Inorganic Light-Emitting Diodes, Advanced Materials, 11(2), 1999, pp. 107-112.*
Translation of Japanese Office Action.

* cited by examiner

*Primary Examiner*—Milton I. Cano
*Assistant Examiner*—Camie S Thompson
(74) *Attorney, Agent, or Firm*—Oliff & Berridge, PLC

(57) ABSTRACT

The present invention relates to a polyester resin including at least one repeating unit represented by the following formula (1):

$$-T_1-Ar_1\underset{N-N}{\overset{O}{\diagup}}Ar_2\left(\underset{N-N}{\overset{O}{\diagup}}Ar_3\right)_n T_2- \quad (1)$$

wherein $Ar_1$, $Ar_2$ and $Ar_3$ independently represent a substituted or unsubstituted arylene group, a substituted or unsubstituted bivalent heterocyclic group, or a combination thereof; $T_1$ and $T_2$ each represent a linear or branched bivalent hydrocarbon group having 1 to 10 carbon atoms; and n represents 0 or 1.

8 Claims, 9 Drawing Sheets

POLYESTER RESIN, FUNCTIONAL DEVICE AND ORGANIC ELECTROLUMINESCENT DEVICE USING POLYESTER RESIN, AND METHOD OF MANUFACTURING ORGANIC ELECTROLUMINESCENT DEVICE

CROSS-REFERENCE TO RELATED APPLICATION

This application claims priority under 35 USC 119 from Japanese Patent Application No. 2002-365413, the disclosure of which is incorporated by reference herein.

BACKGROUND OF THE INVENTION

1. Field of the Invention

The present invention relates to a functional device such as a so-called organic electroluminescent device, which converts electric energy into light for emission and can be used for a variety of light sources in a variety of display devices, electrophotography, illumination, and the like, to useful materials therefor and to a method for manufacturing the organic electroluminescent device.

2. Description of the Related Art

Today, research and development of a variety of display devices is aggressively being carried out. For example, organic electroluminescent devices (hereinafter sometimes referred to as "organic EL devices"), which have an organic thin film formed by vapor deposition of organic compounds (for example, see Applied Physics Letters, 51, pp. 913-915 (1987)) are known. Such organic electroluminescent devices can produce light with high luminance under low voltage and therefore receive attention as promising display devices.

However, a method of manufacturing organic EL devices by vacuum deposition of organic compounds has a problem with respect to productivity. In particular, it is difficult to form organic EL device having a large area by a doping process, because, in the doping process, different materials must be vapor-deposited at the same time with a concentration of each material precisely controlled. In addition, amorphous films of low-molecular materials have poor heat resistance and tend to cause defects such as crystallized portions.

In order to solve such problems, it has been proposed that the low-molecular organic layers should be replaced with high-molecular organic polymer layers, and a variety of organic electroluminescent devices which include a charge transport group-incorporated polymer chain have also been reported. Examples of such a polymer include a π conjugated system, such as poly(paraphenylene vinylene) (for example, see Advanced Materials, p. 4 (1992)). A method of producing devices by coating such a material is suitable in terms of simplification of the process, processibility and production of devices having a large area, and is promising because the resultant device has good heat resistance.

The polymers with the π conjugated system are excellent materials, because they are coatable and have good heat resistance. Since a luminescent portion is in a conjugated main chain of the polymer, however, it is difficult to control a concentration of the luminescent material, and it is also difficult to delicately control color tone and luminescent intensity. In addition, thermal motion of the polymer is caused as the temperature increases with the emission, and the conjugated structure can be disturbed, so that color tone may tend to vary.

Another example of a light emitting device similarly produced through the coating step is a device in which a low-molecular weight fluorescent compound is dispersed in poly (N-vinylcarbazole) (for example, see Japanese Patent Application Laid-Open (JP-A) No. 4-212286). This device is a function separation type-device in which the poly(N-vinylcarbazole) has a charge transport function and the low-molecular weight fluorescent compound has a light emitting function. In this type of device, the type of the fluorescent compound can freely be altered, and therefore, color tone and luminescent intensity can be relatively easily adjusted. Since the poly(N-vinylcarbazole) has a relatively large carbazole group at a side chain, however, it forms a brittle film or it is difficult to form a film with it. In addition, a driving voltage is high, and the durability of such a device is problematic, because brightness tends to decrease when the device is driven after a long period of non-use or is driven continuously.

In view of such problems, polycarbonate having a repeating unit of a diarylene-vinylene-arylene skeleton has been proposed for an organic electroluminescent device produced through the coating step (for example, see JP-A No. 5-247458). It is disclosed that this material can be formed into a thin film by coating and can provide a blue light emitting organic EL device. However, the material has a problem in that film-forming properties are insufficient, a uniform surface is hard to form, and durability is low because of dark spot generation.

In order to solve the above problems, polyethers, polythioethers, and polyesters each having a repeating unit of a diarylene-vinylene-arylene skeleton are disclosed as a material for use in a light emitting device (for example, see JP-A No. 2001-40347). In the device made of such a material, however, the polymer tends to crystallize, because the ether or ester group is directly bonded to the arylene group in the skeleton having the light emitting function. Such a material cannot be sufficient in terms of solubility and film-forming properties.

Several examples have also been proposed in which a polymer whose skeleton has an electron transport function as well as a light emitting function is used to form a film. For example, an oxadiazole skeleton having a high electron transport performance and EL devices in which the oxadiazole is incorporated into a main chain of a polyether or into a side chain of a polyvinyl type polymer are known (for example, see JP-A Nos. 9-188756 and 9-255725).

In general, the oxadiazole skeleton-incorporated polymer has low solubility in an organic solvent and tends to have poor film-forming properties, and these drawbacks are improved by copolymerizing the oxadiazole with a highly soluble structure. In such a case, however, it is difficult to obtain sufficient electron transport performance. Other reported examples include vapor deposition and polymerization of a reactive monomer having the oxadiazole structure in the process of forming a thin film (for example, see JP-A No. 8-88084). However, such a process has a problem with respect to productivity because of the difficulty in controlling a reaction rate of the reactive group, and it is hard to achieve sufficient durable properties due to dark spot generation and the like.

Thus, there has been a demand for a polyester resin that has excellent coatability, adhesion to substrates and durability, and that is a useful material for forming a light emitting device that efficiently produces light with high brightness under low driving voltage. There has also been a demand for a functional device, an organic electroluminescent device and a method of manufacturing the organic electroluminescent device, which each uses such a material.

SUMMARY OF THE INVENTION

A first aspect of the invention is to provide a polyester resin comprising at least one repeating unit represented by the following formula (1):

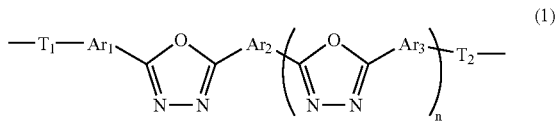

wherein $Ar_1$, $Ar_2$ and $Ar_3$ independently represent a substituted or unsubstituted arylene group, a substituted or unsubstituted bivalent heterocyclic group, or a combination thereof; $T_1$ and $T_2$ represent a linear or branched bivalent hydrocarbon group having 1 to 10 carbon atoms; and n represents 0 or 1.

A second aspect of the invention is to provide a polyester resin comprising at least one repeating unit represented by the following formula (2):

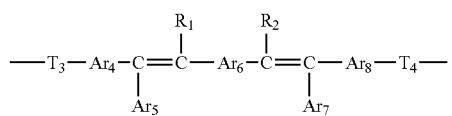

wherein $Ar_4$, $Ar_6$ and $Ar_8$ independently represent a substituted or unsubstituted arylene group, a substituted or unsubstituted bivalent heterocyclic group, or a combination thereof; $Ar_5$ and $Ar_7$ independently represent a substituted or unsubstituted aryl group or a substituted or unsubstituted heterocyclic group; $R_1$ and $R_2$ independently represent a hydrogen atom, a cyano group, an alkyl group, an alkoxy group, an alkylthio group, an aryloxy group, an arylthio group, or a heterocyclic group; and $T_3$ and $T_4$ represent a linear or branched bivalent hydrocarbon group having 1 to 10 carbon atoms.

A third aspect of the invention is to provide a copolymerized polyester resin comprising: at least one repeating unit represented by the above-described formula (1); and at least one repeating unit represented by the above-described formula (2).

A fourth aspect of the invention is to provide a copolymerized polyester resin comprising: at least one of a repeating unit represented by the above-described formula (1) and a repeating unit represented by the above-described formula (2); and a compound having an electron transport function.

A fifth aspect of the invention is to provide a copolymerized polyester resin comprising: at least one of a repeating unit represented by the above-described formula (1) and a repeating unit represented by the above-described formula (2); and a compound having a hole transport function.

A sixth aspect of the invention is to provide a copolymerized polyester resin comprising: at least one of a repeating unit represented by the above-described formula (1) and a repeating unit represented by the above-described formula (2); and a compound having a light emitting function.

A seventh aspect of the invention is to provide a functional device including at least one kind of the above-described polyester resins.

An eighth aspect of the invention is to provide an organic electroluminescent device, including: a pair of electrodes composed of an anode and a cathode, at least one of which is transparent or translucent; and at least one organic compound layer that is sandwiched between the electrodes and contains at least one kind of the above polyester resins.

A ninth aspect of the invention is to provide a method for manufacturing an organic electroluminescent device, including the steps of: forming at least one organic compound layer on a surface of an electrode; and forming a counter electrode on a surface of the at least one organic compound layer, wherein at least one kind of the above-described polyester resins is used to form at least one layer of the at least one organic compound layer in the step of forming the at least one organic compound layer.

According to the invention, the polyester resin including at least one of the repeating units represented by the specific structural formulae can provide an organic EL device with high brightness, high efficiency and long lifetime. According to the invention, a good thin film having few defects such as pinholes can be formed by a coating method such as a spin coating method and a dipping method.

DETAILED DESCRIPTION OF THE INVENTION

Figure 1:
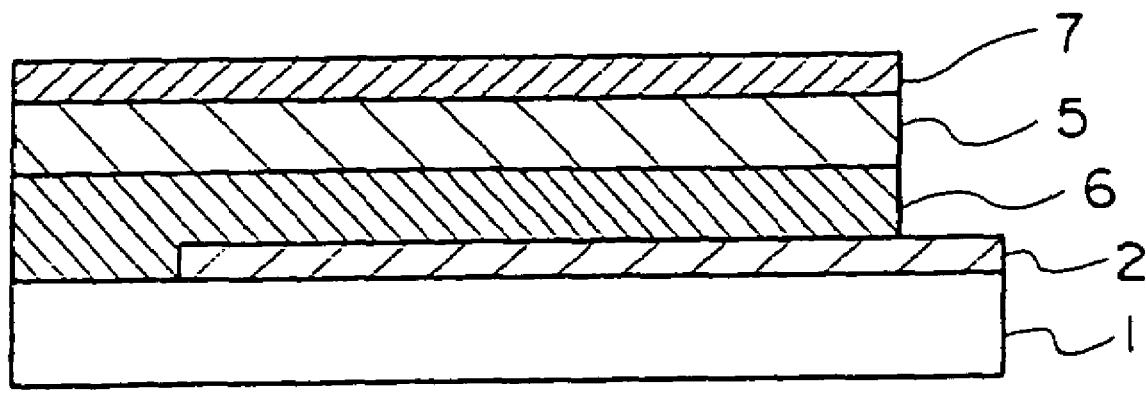
FIG. 1 is a sectional view showing an example of the organic EL device according to the present invention.

The present invention will be described in detail below.

Polyester Resins

The polyester resin of the invention has at least one repeating unit represented by the following formula (1):

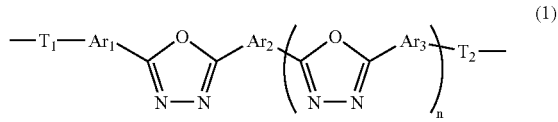

wherein $Ar_1$, $Ar_2$ and $Ar_3$ independently represent a substituted or unsubstituted arylene group, a substituted or unsubstituted bivalent heterocyclic group, or a combination thereof, $T_1$ and $T_2$ independently represent a linear or branched bivalent hydrocarbon group having 1 to 10 carbon atoms, and n represents 0 or 1.

In another embodiment, the polyester resin of the invention has at least one repeating unit represented by the following formula (2):

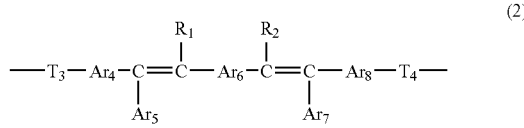
(2)

wherein $Ar_4$, $Ar_6$ and $Ar_1$ independently represent a substituted or unsubstituted arylene group, a substituted or unsubstituted bivalent heterocyclic group, or a combination thereof, $Ar_5$ and $Ar_7$ independently represent a substituted or unsubstituted aryl group or a substituted or unsubstituted heterocyclic group, $R_1$ and $R_2$ independently represent a hydrogen atom, a cyano group, an alkyl group, an alkoxy group, an alkylthio group, an aryloxy group, an arylthio group, or a heterocyclic group, and $T_3$ and $T_4$ independently represent a linear or branched bivalent hydrocarbon group having 1 to 10 carbon atoms.

As defined above, $Ar_1$, $Ar_2$, $Ar_3$, $Ar_1$, $Ar_6$, and $Ar_8$ independently represent an arylene group, a bivalent heterocyclic group or a combination thereof. The arylene group is preferably a monocyclic or condensed-cyclic arylene group having 6 to 60 carbon atoms, more preferably 6 to 40 carbon atoms, and still more preferably 6 to 30 carbon atoms.

Specific examples of the arylene group include phenylene, biphenylene, triphenylene, tetraphenylene, naphthalenediyl, anthracenediyl, phenanthrolinediyl, pyrenediyl, triphenylenediyl, benzophenanthrolinediyl, perylenediyl, pentaphenylenediyl, and pentacenediyl. Among them, phenylene, biphenylene, naphthalenediyl, anthracenediyl, pyrenediyl, and perylenediyl are preferable, and phenylene, biphenylene and triphenylene are more preferable.

The bivalent heterocyclic group is preferably a monocyclic or condensed-cyclic heterocyclic group having 4 to 60 carbon atoms, more preferably a $C_4$ to $C_{60}$ monocyclic or condensed-cyclic heterocyclic group containing at least one of nitrogen, oxygen and sulfur atoms, and still more preferably a five- or six-membered heterocyclic group having 4 to 30 carbon atoms.

Examples of the heterocyclic group include pyrrolediyl, furandiyl, thienylene, pyridinediyl, pyridadinediyl, pyrimidinediyl, pyrazinediyl, quinolinediyl, isoquinolinediyl, cinnolinediyl, quinazolinediyl, quinoxalinediyl, phthalazinediyl, pteridinediyl, acridinediyl, phenazinediyl, and phenanthrolinediyl. Among them, furandiyl, thienylene, pyridinediyl, pyridadinediyl, pyrimidinediyl, pyrazinediyl, quinolinediyl, quinoxalinediyl, and phthalazinediyl are preferable, and thienylene and pyridinediyl are more preferable.

The arylene or heterocyclic group may have a substituent. Examples of the substituent include an alkyl group (preferably those having 1 to 20 carbon atoms, more preferably 1 to 12 carbon atoms, and still more preferably 1 to 8 carbon atoms, for example, methyl, ethyl, iso-propyl, tert-butyl, n-octyl, n-decyl, n-hexadecyl, cyclopropyl, cyclopentyl, and cyclohexyl); an alkenyl group (preferably those having 2 to 20 carbon atoms, more preferably 2 to 12 carbon atoms, and still more preferably 2 to 8 carbon atoms, for example, vinyl, allyl, 2-butenyl, and 3-pentenyl); an alkynyl group (preferably those having 2 to 20 carbon atoms, more preferably 2 to 12 carbon atoms, and still more preferably 2 to 8 carbon atoms, for example, propargyl and 3-pentynyl); an aryl group (preferably those having 6 to 30 carbon atoms, more preferably 6 to 20 carbon atoms, and still more preferably 6 to 12 carbon atoms, for example, phenyl, p-methylphenyl and naphthyl); an amino group (preferably those having 0 to 20 carbon atoms, more preferably 0 to 10 carbon atoms, and still more preferably 0 to 6 carbon atoms, for example, amino, methylamino, dimethylamino, diethylamino, and dibenzylamino); an alkoxy group (preferably those having 1 to 20 carbon atoms, more preferably 1 to 12 carbon atoms, and still more preferably 1 to 8 carbon atoms, for example, methoxy, ethoxy and butoxy); an aryloxy group (preferably those having 6 to 20 carbon atoms, more preferably 6 to 16 carbon atoms, and still more preferably 6 to 12 carbon atoms, for example, phenyloxy and 2-naphthyloxy); an acyl group (preferably those having 1 to 20 carbon atoms, more preferably 1 to 16 carbon atoms, and still more preferably 1 to 12 carbon atoms, for example, acetyl, benzoyl, formyl, and pivaloyl); an alkoxycarbonyl group (preferably those having 2 to 20 carbon atoms, more preferably 2 to 16 carbon atoms, and still more preferably 2 to 12 carbon atoms, for example, methoxycarbonyl and ethoxycarbonyl); an aryloxycarbonyl group (preferably those having 7 to 20 carbon atoms, more preferably 7 to 16 carbon atoms, and still more preferably 7 to 10 carbon atoms, for example, phenyloxycarbonyl); an acyloxy group (preferably those having 2 to 20 carbon atoms, more preferably 2 to 16 carbon atoms, and still more preferably 2 to 10 carbon atoms, for example, acetoxy and benzoyloxy); an acylamino group (preferably those having 2 to 20 carbon atoms, more preferably 2 to 16 carbon atoms, and still more preferably 2 to 10 carbon atoms, for example, acetylamino and benzoylamino); an alkoxycarbonylamino group (preferably those having 2 to 20 carbon atoms, more preferably 2 to 16 carbon atoms, and still more preferably 2 to 12 carbon atoms, for example, methoxycarbonylamino); an aryloxycarbonylamino group (preferably those having 7 to 20 carbon atoms, more preferably 7 to 16 carbon atoms, and still more preferably 7 to 12 carbon atoms, for example, phenyloxycarbonylamino); a sulfonylamino group (preferably those having 1 to 20 carbon atoms, more preferably 1 to 16 carbon atoms, and still more preferably 1 to 12 carbon atoms, for example, methanesulfonylamino and benzenesulfonylamino); a sulfamoyl group (preferably those having 0 to 20 carbon atoms, more preferably 0 to 16 carbon atoms, and still more preferably 0 to 12 carbon atoms, for example, sulfamoyl, methylsulfamoyl, dimethylsulfamoyl, and phenylsulfamoyl); a carbamoyl group (preferably those having 1 to 20 carbon atoms, more preferably 1 to 16 carbon atoms, and still more preferably 1 to 12 carbon atoms, for example, carbamoyl, methylcarbamoyl, diethylcarbamoyl, and phenylcarbamoyl); an alkylthio group (preferably those having 1 to 20 carbon atoms, more preferably 1 to 16 carbon atoms, and still more preferably 1 to 12 carbon atoms, for example, methylthio and ethylthio); an arylthio group (preferably those having 6 to 20 carbon atoms, more preferably 6 to 16 carbon atoms, and still more preferably 6 to 12 carbon atoms, for example, phenylthio); a sulfonyl group (preferably those having 1 to 20 carbon atoms, more preferably 1 to 16 carbon atoms, and still more preferably 1 to 12 carbon atoms, for example, mesyl and tosyl); a sulfinyl group (preferably those having 1 to 20 carbon atoms, more preferably 1 to 16 carbon atoms, and still more preferably 1 to 12 carbon atoms, for example, methanesulfinyl and benzenesulfinyl); an ureido group (preferably those having 1 to 20 carbon atoms, more preferably 1 to 16 carbon atoms, and still more preferably 1 to 12 carbonatoms, for example, ureido, methylureido and phenylureido); a phosphoric acid amide group (preferably those having 1 to 20 carbon atoms, more preferably 1 to 16 carbon atoms, and still more preferably 1 to 12 carbon atoms, for example, diethylphosphoric acid amide and phenylphosphoric acid amide); a hydroxyl group; a mercapto group; a halogen atom (such as fluorine, chlorine, bromine, or iodine atom); a cyano group; a sulfo group; a carboxyl group; a nitro group; a hydroxamate group; a sulfino group; a hydrazino group; an imino group; a heterocyclic group (preferably those having 1 to 30 carbon atoms, and more preferably 1 to 12 carbon atoms, with the hetero atom being a nitrogen, oxygen or sulfur atom, for example, imidazolyl, pyridyl, quinolyl, furyl, piperidyl, morpholino, benzoxazolyl, benzimidazolyl, and benzthiazolyl); and a silyl group (preferably those having 3 to 40 carbon atoms, more preferably 3 to 30 carbon atoms, and still more preferably 3 to 24 carbon atoms, for example, trimethylsilyl and triphenylsilyl).

These substituents may further be substituted. When the arylene group or the hetero group has at least two substituents, the at least two substituents may be the same or different and may bond to each other to form a ring, if possible.

Examples of the substituent for the further substitution preferably include an alkyl group, an alkenyl group, an aralkyl group, an aryl group, an alkoxy group, an aryloxy group, an alkylthio group, an arylthio group, a halogen atom, a cyano group, and a heterocyclic group. Among them, an alkyl group, an aryl group, an alkoxy group, an aryloxy group, an alkylthio group, an arylthio group, and a heterocyclic group are preferable, and an aryl group and an aromatic heterocyclic group are more preferable.

As defined above, $Ar_5$ and $Ar_7$ independently represent an aryl group or a heterocyclic group.

The aryl group is preferably a monocyclic or condensed-cyclic aryl group having 6 to 40 carbon atoms (such as phenyl, naphthyl, biphenyl, anthryl, phenanthryl, pyrenyl, benzophenanthryl, triphenylenyl, naphthacenyl, chrysenyl, picenyl, perylenyl, pentaphenyl, and pentacenyl), more preferably those having 6 to 30 carbon atoms (such as phenyl, naphthyl, anthryl, phenanthryl, pyrenyl, and perylenyl), and still more preferably those having 6 to 20 carbon atoms (such as phenyl, naphthyl, biphenyl, anthryl, phenanthryl, pyrenyl, and perylenyl).

The heterocyclic group represented by $Ar_5$ or $Ar_7$ may be a 3 to 10-membered saturated or unsaturated hetero ring including at least one of N, O and S atoms and may be monocyclic or form a condensed ring together with any other ring.

Examples of the above heterocyclic group include pyrrolidine, piperidine, piperazine, morpholine, thiophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridine, phenanthroline, phenazine, tetrazole, benzimidazole, benzoxazole, benzothiazole, benzotriazole, and tetrazaindene.

Preferred examples of these groups include 5 or 6-membered aromatic heterocyclic groups, and more preferred examples include thiophene, furan, pyrrole, imidazole, pyrazole, pyridine, pyrimidine, thiazole, thiadiazole, oxazole, oxadiazole, quinoline, benzimidazole, benzoxazole, and benzothiazole, and still more preferred examples include thiophene, furan, pyridine, pyrimidine, thiazole, thiadiazole, oxazoline, oxazole, oxadiazole, and quinoline.

As defined above, $R_1$ and $R_2$ independently represent a hydrogen atom, a cyano group, an alkyl group, an alkoxy group, an alkylthiol group, an aryloxy group, or a heterocyclic group. $R_1$ and $R_2$ are particularly preferably a hydrogen atom or a cyano group.

The alkyl group preferably has 1 to 20 carbon atoms, more preferably 1 to 12 carbon atoms, and still more preferably 1 to 8 carbon atoms. Examples of the alkyl group include methyl, ethyl, propyl, n-butyl, iso-propyl, n-hexadecyl, cyclopropyl, and cyclopentyl. The alkoxy group preferably has 1 to 20 carbon atoms, more preferably 1 to 12 carbon atoms, and still more preferably 1 to 8 carbon atoms. Examples of the alkoxy group include methoxy, ethoxy and butoxy. The alkylthio group preferably has 1 to 20 carbon atoms, more preferably 1 to 16 carbon atoms, and still more preferably 1 to 12 carbon atoms. Examples of the alkylthio group include methylthio and ethylthio. The aryloxy group preferably has 6 to 20 carbon atoms, more preferably 6 to 16 carbon atoms, and still more preferably 6 to 12 carbon atoms. Examples of the aryloxy group include phenyloxy and 2-naphthyloxy. The arylthio group preferably has 6 to 20 carbon atoms, more preferably 6 to 16 carbon atoms, and still more preferably 6 to 12 carbon atoms. Examples of the arylthio group include phenylthio. The heterocyclic group preferably has 1 to 20 carbon atoms, and more preferably 1 to 12 carbon atoms. The hetero atom thereof may be a nitrogen, oxygen or sulfur atom. Examples of the heterocyclic group include imidazolyl, pyridyl, quinolyl, furyl, piperidyl, morpholino, benzoxazolyl, benzimidazolyl, and benzothiazolyl.

As defined above, $T_1$, $T_2$, $T_3$, and $T_4$ independently represent an linear or branched bivalent hydrocarbon group having 1 to 10 carbon atoms, and preferably 1 to 4 carbon atoms, and may be, for example, a methylene group, an ethylene group, a propylene group, or a butylene group.

As shown above, the polyester resin of the invention generally includes a structural unit that has a low solubility in an organic solvent. However, the bivalent hydrocarbon group such as $T_1$, $T_2$, $T_3$, and $T_4$ directly bonded to such a less soluble structural unit provides the polyester resin with significantly increased solubility.

Thus, the polyester resin including the repeating unit of the invention can easily form a coating film by the steps of dissolving it in an organic solvent and applying the solution.

In general, if the compound layer is partially crystallized in the organic EL device, the crystallized portion will be a defect in light emitting. In the organic EL device with an organic compound layer including the polyester resin of the invention, however, the effect of $T_1$, $T_2$, $T_3$, $T_4$, and the like leads to an increased flexibility in the molecule so that the crystallization can be suppressed.

Examples of the compound (the repeating unit) represented by formula (1) are shown in Tables 1 to 18 below. Examples of the compound (the repeating unit) represented by formula (2) are also shown in Tables 19 to 24 below. However, such examples are not intended to limit the scope of the invention.

TABLE 1

| Compound No. | n | Ar₁ | Ar₂ | Ar₃ | T₁ | T₂ |
|---|---|---|---|---|---|---|
| (1) | 0 | 1,4-phenylene | 1,4-phenylene | — | —CH$_2$— | —CH$_2$— |
| (2) | 0 | 1,4-phenylene | 1,4-phenylene | — | —CH$_2$CH$_2$— | —CH$_2$CH$_2$— |
| (3) | 0 | 1,4-phenylene | 1,4-phenylene | — | —CH$_2$CH$_2$CH$_2$— | —CH$_2$CH$_2$CH$_2$— |
| (4) | 0 | 1,4-phenylene | 1,4-phenylene | — | —(CH$_2$)$_4$— | —(CH$_2$)$_4$— |
| (5) | 0 | 1,3-phenylene | 1,3-phenylene | — | —CH$_2$— | —CH$_2$— |
| (6) | 0 | 1,3-phenylene | 1,3-phenylene | — | —CH$_2$CH$_2$— | —CH$_2$CH$_2$— |
| (7) | 0 | 1,3-phenylene | 1,3-phenylene | — | —CH$_2$CH$_2$CH$_2$— | —CH$_2$CH$_2$CH$_2$— |
| (8) | 0 | 1,3-phenylene | 1,3-phenylene | — | —(CH$_2$)$_4$— | —(CH$_2$)$_4$— |
| (9) | 0 | 1,4-phenylene | 1,4-naphthylene | — | —CH$_2$— | —CH$_2$— |

TABLE 2

| Compound No. | n | Ar₁ | Ar₂ | Ar₃ | T₁ | T₂ |
|---|---|---|---|---|---|---|
| (10) | 0 | 1,4-phenylene | 1,4-naphthylene | — | —CH$_2$CH$_2$— | —CH$_2$CH$_2$— |
| (11) | 0 | 1,4-phenylene | 1,4-naphthylene | — | —CH$_2$CH$_2$CH$_2$— | —CH$_2$CH$_2$CH$_2$— |

TABLE 2-continued

| Compound No. | n | Ar₁ | Ar₂ | Ar₃ | T₁ | T₂ |
|---|---|---|---|---|---|---|
| (12) | 0 | 1,4-phenylene | 1,4-naphthylene | — | —(CH$_2$)$_4$— | —(CH$_2$)$_4$— |
| (13) | 0 | 1,3-phenylene | 1,4-naphthylene | — | —CH$_2$— | —CH$_2$— |
| (14) | 0 | 1,3-phenylene | 1,4-naphthylene | — | —CH$_2$CH$_2$— | —CH$_2$CH$_2$— |
| (15) | 0 | 1,3-phenylene | 1,4-naphthylene | — | —CH$_2$CH$_2$CH$_2$— | —CH$_2$CH$_2$CH$_2$— |
| (16) | 0 | 1,3-phenylene | 1,4-naphthylene | — | —(CH$_2$)$_4$— | —(CH$_2$)$_4$— |

TABLE 3

| Compound No. | n | Ar₁ | Ar₂ | Ar₃ | T₁ | T₂ |
|---|---|---|---|---|---|---|
| (17) | 0 | 4,4'-biphenylene | 1,4-phenylene | — | —CH$_2$— | —CH$_2$— |
| (18) | 0 | 4,4'-biphenylene | 1,4-phenylene | — | —CH$_2$CH$_2$— | —CH$_2$CH$_2$— |
| (19) | 0 | 4,4'-biphenylene | 1,4-phenylene | — | —CH$_2$CH$_2$CH$_2$— | —CH$_2$CH$_2$CH$_2$— |
| (20) | 0 | 4,4'-biphenylene | 1,4-phenylene | — | —(CH$_2$)$_4$— | —(CH$_2$)$_4$— |
| (21) | 0 | 4,4'-biphenylene | 1,3-phenylene | — | —CH$_2$— | —CH$_2$— |

TABLE 3-continued

| Compound No. | n | Ar₁ | Ar₂ | Ar₃ | T₁ | T₂ |
|---|---|---|---|---|---|---|
| (22) | 0 | biphenyl-4,4'-diyl | 1,3-phenylene | — | —CH₂CH₂— | —CH₂CH₂— |
| (23) | 0 | biphenyl-4,4'-diyl | 1,3-phenylene | — | —CH₂CH₂CH₂— | —CH₂CH₂CH₂— |
| (24) | 0 | biphenyl-4,4'-diyl | 1,3-phenylene | — | —(CH₂)₄— | —(CH₂)₄— |
| (25) | 0 | naphthalene-2,6-diyl | 1,4-phenylene | — | —CH₂— | —CH₂— |

TABLE 4

| Compound No. | n | Ar₁ | Ar₂ | Ar₃ | T₁ | T₂ |
|---|---|---|---|---|---|---|
| (26) | 0 | naphthalene-2,6-diyl | 1,4-phenylene | — | —CH₂CH₂— | —CH₂CH₂— |
| (27) | 0 | naphthalene-2,6-diyl | 1,4-phenylene | — | —CH₂CH₂CH₂— | —CH₂CH₂CH₂— |
| (28) | 0 | naphthalene-2,6-diyl | 1,4-phenylene | — | —(CH₂)₄— | —(CH₂)₄— |
| (29) | 0 | naphthalene-2,6-diyl | 1,3-phenylene | — | —CH₂— | —CH₂— |
| (30) | 0 | naphthalene-2,6-diyl | 1,3-phenylene | — | —CH₂CH₂— | —CH₂CH₂— |
| (31) | 0 | naphthalene-2,6-diyl | 1,3-phenylene | — | —CH₂CH₂CH₂— | —CH₂CH₂CH₂— |
| (32) | 0 | naphthalene-2,6-diyl | 1,3-phenylene | — | —(CH₂)₄— | —(CH₂)₄— |
| (33) | 0 | naphthalene-1,4-diyl | naphthalene-1,4-diyl | — | —CH₂— | —CH₂— |

TABLE 4-continued
| Compound No. | n | Ar₁ | Ar₂ | Ar₃ | T₁ | T₂ |
|---|---|---|---|---|---|---|
| (34) | 0 | 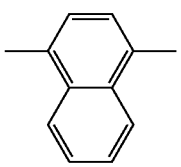 | 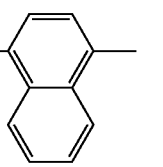 | — | —CH₂CH₂— | —CH₂CH₂— |
TABLE 5
| Compound No. | n | Ar₁ | Ar₂ | Ar₃ | T₁ | T₂ |
|---|---|---|---|---|---|---|
| (35) | 0 | 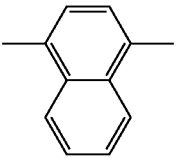 | 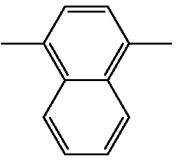 | — | —CH₂CH₂CH₂— | —CH₂CH₂CH₂— |
| (36) | 0 | 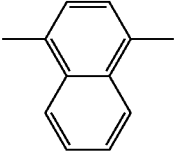 | 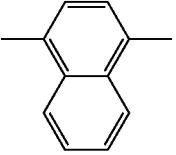 | — | —(CH₂)₄— | —(CH₂)₄— |
| (37) | 0 | 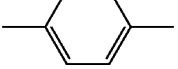 | 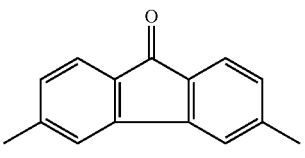 | — | —CH₂— | —CH₂— |
| (38) | 0 |  | 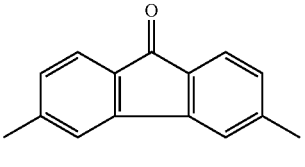 | — | —CH₂CH₂— | —CH₂CH₂— |
| (39) | 0 | 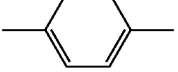 | 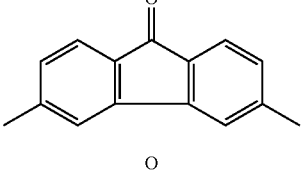 | — | —CH₂CH₂CH₂— | —CH₂CH₂CH₂— |
| (40) | 0 | 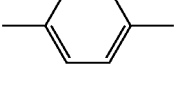 | 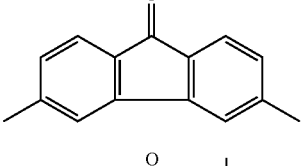 | — | —(CH₂)₄— | —(CH₂)₄— |
| (41) | 0 | 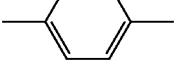 | 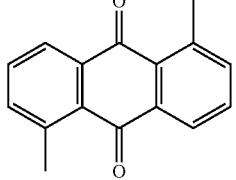 | — | —CH₂— | —CH₂— |

TABLE 6
| Compound No. | n | Ar₁ | Ar₂ | Ar₃ | T₁ | T₂ |
|---|---|---|---|---|---|---|
| (42) | 0 |  | 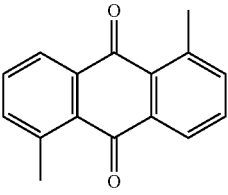 | — | —CH₂CH₂— | —CH₂CH₂— |
| (43) | 0 | 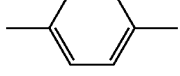 | 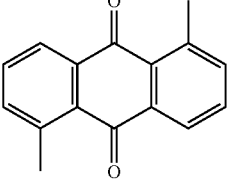 | — | —CH₂CH₂CH₂— | —CH₂CH₂CH₂— |
| (44) | 0 |  | 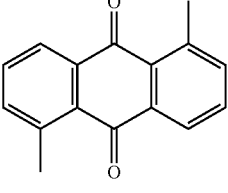 | — | —(CH₂)₄— | —(CH₂)₄— |
| (45) | 0 |  | 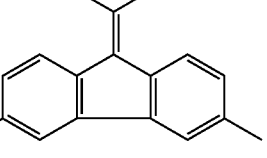 | — | —CH₂— | —CH₂— |
| (46) | 0 |  | 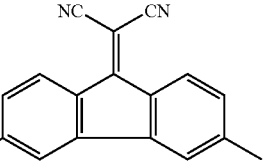 | — | —CH₂CH₂— | —CH₂CH₂— |
TABLE 7
| Compound No. | n | Ar₁ | Ar₂ | Ar₃ | T₁ | T₂ |
|---|---|---|---|---|---|---|
| (47) | 0 | 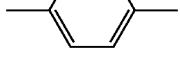 | 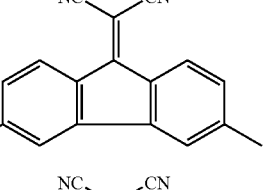 | — | —CH₂CH₂CH₂— | —CH₂CH₂CH₂— |
| (48) | 0 | 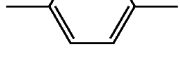 | 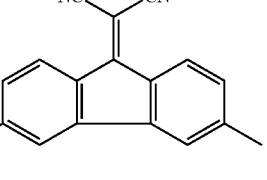 | — | —(CH₂)₄— | —(CH₂)₄— |

TABLE 7-continued

| Compound No. | n | Ar$_1$ | Ar$_2$ | Ar$_3$ | T$_1$ | T$_2$ |
|---|---|---|---|---|---|---|
| (49) | 0 | m-phenylene | 1,4-dimethyl-anthraquinone | — | —CH$_2$— | —CH$_2$— |
| (50) | 0 | m-phenylene | 1,4-dimethyl-anthraquinone | — | —CH$_2$CH$_2$— | —CH$_2$CH$_2$— |
| (51) | 0 | m-phenylene | 1,4-dimethyl-anthraquinone | — | —CH$_2$CH$_2$CH$_2$— | —CH$_2$CH$_2$CH$_2$— |

TABLE 8

| Compound No. | n | Ar$_1$ | Ar$_2$ | Ar$_3$ | T$_1$ | T$_2$ |
|---|---|---|---|---|---|---|
| (52) | 0 | m-phenylene | 1,4-dimethyl-anthraquinone | — | —(CH$_2$)$_4$— | —(CH$_2$)$_4$— |
| (53) | 0 | m-phenylene | 2,5-dimethyl-benzoquinone | — | —CH$_2$— | —CH$_2$— |
| (54) | 0 | m-phenylene | 2,5-dimethyl-benzoquinone | — | —CH$_2$CH$_2$— | —CH$_2$CH$_2$— |

TABLE 8-continued
| Compound No. | n | Ar$_1$ | Ar$_2$ | Ar$_3$ | T$_1$ | T$_2$ |
|---|---|---|---|---|---|---|
| (55) | 0 | 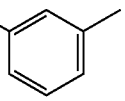 | 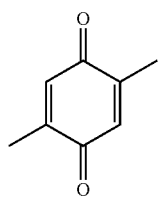 | — | —CH$_2$CH$_2$CH$_2$— | —CH$_2$CH$_2$CH$_2$— |
| (56) | 0 | 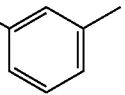 | 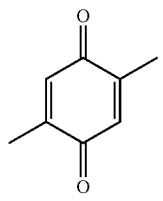 | — | —(CH$_2$)$_4$— | —(CH$_2$)$_4$— |
TABLE 9
| Compound No. | n | Ar$_1$ | Ar$_2$ | Ar$_3$ | T$_1$ | T$_2$ |
|---|---|---|---|---|---|---|
| (57) | 0 | 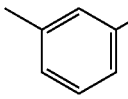 | 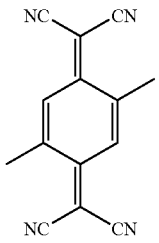 | — | —CH$_2$— | —CH$_2$— |
| (58) | 0 | 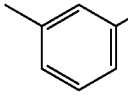 | 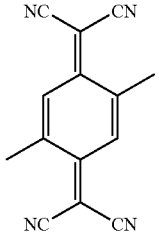 | — | —CH$_2$CH$_2$— | —CH$_2$CH$_2$— |
| (59) | 0 | 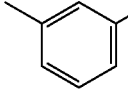 | 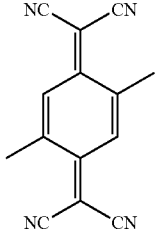 | — | —CH$_2$CH$_2$CH$_2$— | —CH$_2$CH$_2$CH$_2$— |
| (60) | 0 | 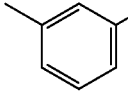 | 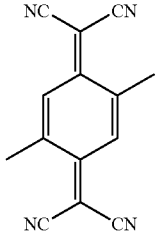 | — | —(CH$_2$)$_4$— | —(CH$_2$)$_4$— |

TABLE 9-continued

| Compound No. | n | Ar₁ | Ar₂ | Ar₃ | T₁ | T₂ |
|---|---|---|---|---|---|---|
| (61) | 1 | phenylene | phenylene | phenylene | —CH₂— | —CH₂— |

TABLE 10

| Compound No. | n | Ar₁ | Ar₂ | Ar₃ | T₁ | T₂ |
|---|---|---|---|---|---|---|
| (62) | 1 | phenylene | phenylene | phenylene | —CH₂CH₂— | —CH₂CH₂— |
| (63) | 1 | phenylene | phenylene | phenylene | —CH₂CH₂CH₂— | —CH₂CH₂CH₂— |
| (64) | 1 | phenylene | phenylene | phenylene | —(CH₂)₄— | —(CH₂)₄— |
| (65) | 1 | phenylene | biphenylene | phenylene | —CH₂— | —CH₂— |
| (66) | 1 | phenylene | biphenylene | phenylene | —CH₂CH₂— | —CH₂CH₂— |
| (67) | 1 | phenylene | biphenylene | phenylene | —CH₂CH₂CH₂— | —CH₂CH₂CH₂— |
| (68) | 1 | phenylene | biphenylene | phenylene | —(CH₂)₄— | —(CH₂)₄— |
| (69) | 1 | phenylene | naphthylene | phenylene | —CH₂— | —CH₂— |
| (70) | 1 | phenylene | naphthylene | phenylene | —CH₂CH₂— | —CH₂CH₂— |

TABLE 11

| Compound No. | n | Ar₁ | Ar₂ | Ar₃ | T₁ | T₂ |
|---|---|---|---|---|---|---|
| (71) | 1 | p-phenylene | 1,4-naphthylene | p-phenylene | —CH₂CH₂CH₂— | —CH₂CH₂CH₂— |
| (72) | 1 | p-phenylene | 1,4-naphthylene | p-phenylene | —(CH₂)₄— | —(CH₂)₄— |
| (73) | 1 | m-phenylene | 4,4'-biphenylene | m-phenylene | —CH₂— | —CH₂— |
| (74) | 1 | m-phenylene | 4,4'-biphenylene | m-phenylene | —CH₂CH₂— | —CH₂CH₂— |
| (75) | 1 | m-phenylene | 4,4'-biphenylene | m-phenylene | —CH₂CH₂CH₂— | —CH₂CH₂CH₂— |
| (76) | 1 | m-phenylene | 4,4'-biphenylene | m-phenylene | —(CH₂)₄— | —(CH₂)₄— |
| (77) | 1 | m-phenylene | 1,4-naphthylene | m-phenylene | —CH₂— | —CH₂— |
| (78) | 1 | m-phenylene | 1,4-naphthylene | m-phenylene | —CH₂CH₂— | —CH₂CH₂— |

TABLE 12

| Compound No. | n | Ar₁ | Ar₂ | Ar₃ | T₁ | T₂ |
|---|---|---|---|---|---|---|
| (79) | 1 | m-phenylene | 1,4-naphthylene | m-phenylene | —CH₂CH₂CH₂— | —CH₂CH₂CH₂— |

TABLE 12-continued

| Compound No. | n | Ar₁ | Ar₂ | Ar₃ | T₁ | T₂ |
|---|---|---|---|---|---|---|
| (80) | 1 | m-phenylene | 1,4-naphthylene | m-phenylene | —(CH₂)₄— | —(CH₂)₄— |
| (81) | 1 | p-phenylene | 2,6-naphthylene | p-phenylene | —CH₂— | —CH₂— |
| (82) | 1 | p-phenylene | 2,6-naphthylene | p-phenylene | —CH₂CH₂— | —CH₂CH₂— |
| (83) | 1 | p-phenylene | 2,6-naphthylene | p-phenylene | —CH₂CH₂CH₂— | —CH₂CH₂CH₂— |
| (84) | 1 | p-phenylene | 2,6-naphthylene | p-phenylene | —(CH₂)₄— | —(CH₂)₄— |
| (85) | 1 | m-phenylene | 2,6-naphthylene | m-phenylene | —CH₂— | —CH₂— |
| (86) | 1 | m-phenylene | 2,6-naphthylene | m-phenylene | —CH₂CH₂— | —CH₂CH₂— |
| (87) | 1 | m-phenylene | 2,6-naphthylene | m-phenylene | —CH₂CH₂CH₂— | —CH₂CH₂CH₂— |

TABLE 13

| Compound No. | n | Ar₁ | Ar₂ | Ar₃ | T₁ | T₂ |
|---|---|---|---|---|---|---|
| (88) | 1 | m-phenylene | 2,6-naphthylene | m-phenylene | —(CH₂)₄— | —(CH₂)₄— |
| (89) | 1 | p-phenylene | 3,6-dimethylpyridazine-4,5-diyl | p-phenylene | —CH₂— | —CH₂— |
| (90) | 1 | p-phenylene | 3,6-dimethylpyridazine-4,5-diyl | p-phenylene | —CH₂CH₂— | —CH₂CH₂— |

TABLE 13-continued
| Compound No. | n | Ar₁ | Ar₂ | Ar₃ | T₁ | T₂ |
|---|---|---|---|---|---|---|
| (91) | 1 |  | 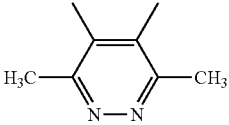 |  | —CH₂CH₂CH₂— | —CH₂CH₂CH₂— |
| (92) | 1 | 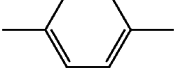 | 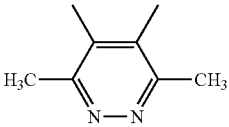 |  | —(CH₂)₄— | —(CH₂)₄— |
| (93) | 1 |  | 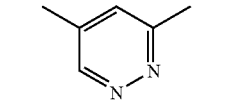 |  | —CH₂— | —CH₂— |
| (94) | 1 | 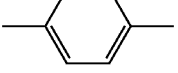 | 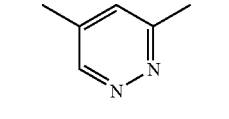 | 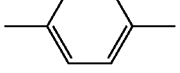 | —CH₂CH₂— | —CH₂CH₂— |
| (95) | 1 | 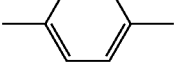 | 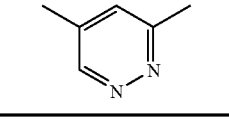 | 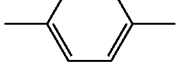 | —CH₂CH₂CH₂— | —CH₂CH₂CH₂— |
TABLE 14
| Compound No. | n | Ar₁ | Ar₂ | Ar₃ | T₁ | T₂ |
|---|---|---|---|---|---|---|
| (96) | 1 | 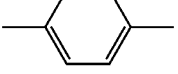 | 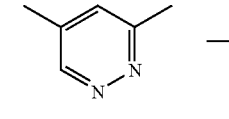 | 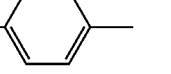 | —(CH₂)₄— | —(CH₂)₄— |
| (97) | 1 | 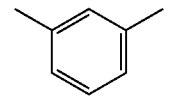 | 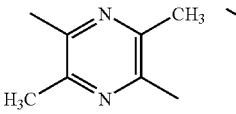 | 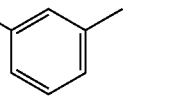 | —CH₂— | —CH₂— |
| (98) | 1 | 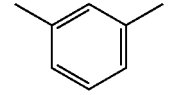 | 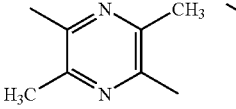 | 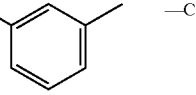 | —CH₂CH₂— | —CH₂CH₂— |
| (99) | 1 | 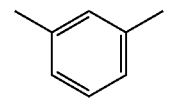 | 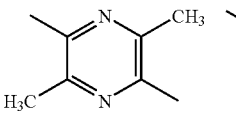 | 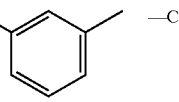 | —CH₂CH₂CH₂— | —CH₂CH₂CH₂— |
| (100) | 1 | 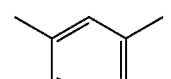 | 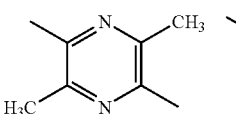 | 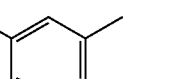 | —(CH₂)₄— | —(CH₂)₄— |
| (101) | 1 | 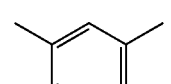 | 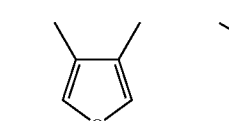 | 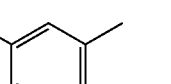 | —CH₂— | —CH₂— |

TABLE 14-continued
| Compound No. | n | Ar₁ | Ar₂ | Ar₃ | T₁ | T₂ |
|---|---|---|---|---|---|---|
| (102) | 1 | 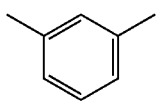 |  | 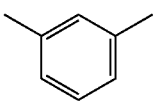 | —CH₂CH₂— | —CH₂CH₂— |
TABLE 15
| Compound No. | n | Ar₁ | Ar₂ | Ar₃ | T₁ | T₂ |
|---|---|---|---|---|---|---|
| (103) | 1 | 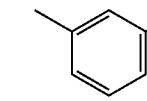 |  | 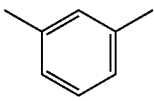 | —CH₂CH₂CH₂— | —CH₂CH₂CH₂— |
| (104) | 1 | 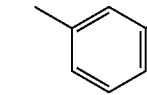 |  | 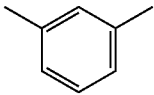 | —(CH₂)₄— | —(CH₂)₄— |
| (105) | 1 | 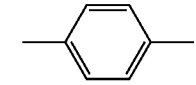 | 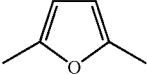 | 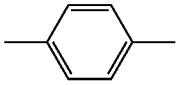 | —CH₂— | —CH₂— |
| (106) | 1 | 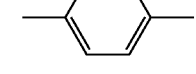 | 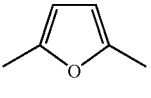 | 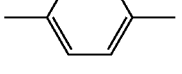 | —CH₂CH₂— | —CH₂CH₂— |
| (107) | 1 | 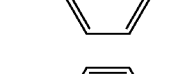 | 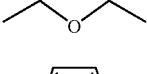 | 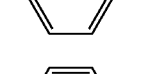 | —CH₂CH₂CH₂— | —CH₂CH₂CH₂— |
| (108) | 1 | 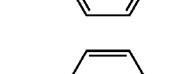 |  | 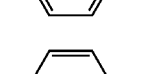 | —(CH₂)₄— | —(CH₂)₄— |
| (109) | 1 |  | 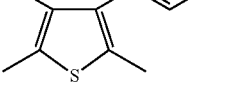 |  | —CH₂— | —CH₂— |
TABLE 16
| Compound No. | n | Ar₁ | Ar₂ | Ar₃ | T₁ | T₂ |
|---|---|---|---|---|---|---|
| (110) | 1 | 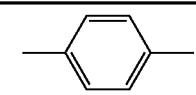 | 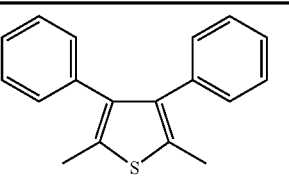 | 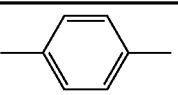 | —CH₂CH₂— | —CH₂CH₂— |

TABLE 16-continued
| Compound No. | n | Ar₁ | Ar₂ | Ar₃ | T₁ | T₂ |
|---|---|---|---|---|---|---|
| (111) | 1 | 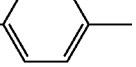 | 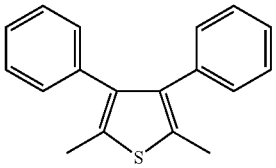 |  | —CH₂CH₂CH₂— | —CH₂CH₂CH₂— |
| (112) | 1 | 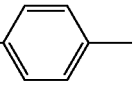 | 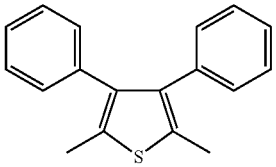 |  | —(CH₂)₄— | —(CH₂)₄— |
| (113) | 1 | 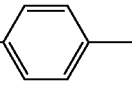 | 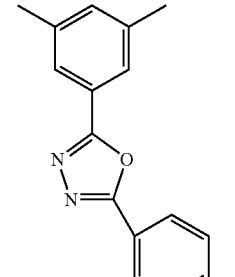 |  | —CH₂— | —CH₂— |
| (114) | 1 | 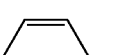 | 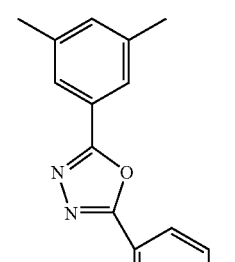 | 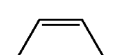 | —CH₂CH₂— | —CH₂CH₂— |
TABLE 17
| Compound No. | n | Ar₁ | Ar₂ | Ar₃ | T₁ | T₂ |
|---|---|---|---|---|---|---|
| (115) | 1 | | | | —CH₂CH₂CH₂— | —CH₂CH₂CH₂— |

TABLE 17-continued

| Compound No. | n | Ar₁ | Ar₂ | Ar₃ | T₁ | T₂ |
|---|---|---|---|---|---|---|
| (116) | 1 | 1,4-phenylene | 5-phenyl-1,3,4-oxadiazol-2-yl-substituted 1,3-phenylene | 1,4-phenylene | —(CH₂)₄— | —(CH₂)₄— |
| (117) | 1 | 1,3-phenylene | 5-phenyl-1,3,4-oxadiazol-2-yl-substituted 1,3-phenylene | 1,3-phenylene | —CH₂— | —CH₂— |

TABLE 18

| Compound No. | n | Ar₁ | Ar₂ | Ar₃ | T₁ | T₂ |
|---|---|---|---|---|---|---|
| (118) | 1 | 1,3-phenylene | 5-phenyl-1,3,4-oxadiazol-2-yl-substituted 1,3-phenylene | 1,3-phenylene | —CH₂CH₂— | —CH₂CH₂— |
| (119) | 1 | 1,3-phenylene | 5-phenyl-1,3,4-oxadiazol-2-yl-substituted 1,3-phenylene | 1,3-phenylene | —CH₂CH₂CH₂— | —CH₂CH₂CH₂— |

TABLE 18-continued

| Compound No. | n | Ar₁ | Ar₂ | Ar₃ | T₁ | T₂ |
|---|---|---|---|---|---|---|
| (120) | 1 | (m-phenylene) | (3,5-disubstituted phenyl with 2-phenyl-1,3,4-oxadiazol-5-yl substituent) | (m-phenylene) | —(CH₂)₄— | —(CH₂)₄— |

TABLE 19

| Compound No. | Ar₄ | Ar₅ | Ar₆ | Ar₇ | Ar₈ |
|---|---|---|---|---|---|
| (121) | p-phenylene | p-phenylene | p-phenylene | p-phenylene | p-phenylene |
| (122) | p-phenylene | p-phenylene | p-phenylene | p-phenylene | p-phenylene |
| (123) | p-phenylene | p-phenylene | p-phenylene | p-phenylene | p-phenylene |
| (124) | p-phenylene | p-phenylene | p-phenylene | p-phenylene | p-phenylene |
| (125) | m-phenylene | p-phenylene | p-phenylene | p-phenylene | m-phenylene |
| (126) | m-phenylene | p-phenylene | p-phenylene | p-phenylene | m-phenylene |
| (127) | m-phenylene | p-phenylene | p-phenylene | p-phenylene | m-phenylene |
| (128) | m-phenylene | pyridazinyl | p-phenylene | p-phenylene | m-phenylene |
| (129) | biphenylene | biphenylene | biphenylene | — | — |
| (130) | biphenylene | biphenylene | biphenylene | — | — |

TABLE 19-continued

| Compound No. | R₁ | R₂ | T₃ | T₄ |
|---|---|---|---|---|
| (121) | —H | —H | —CH₂— | —CH₂— |
| (122) | —H | —H | —CH₂CH₂— | —CH₂CH₂— |
| (123) | —H | —H | —CH₂CH₂CH₂— | —CH₂CH₂CH₂— |
| (124) | —H | —H | —(CH₂)₄— | —(CH₂)₄— |
| (125) | —H | —H | —CH₂— | —CH₂— |
| (126) | —H | —H | —CH₂CH₂— | —CH₂CH₂— |
| (127) | —H | —H | —CH₂CH₂CH₂— | —CH₂CH₂CH₂— |
| (128) | —H | —H | —(CH₂)₄— | —(CH₂)₄— |
| (129) | —H | —H | —CH₂— | —CH₂— |
| (130) | —H | —H | —CH₂CH₂— | —CH₂CH₂— |

TABLE 20

| Compound No. | Ar₄ | Ar₅ | Ar₆ |
|---|---|---|---|
| (131) | 1,4-phenylene | phenyl | 4,4'-biphenylene |
| (132) | 1,4-phenylene | phenyl | 4,4'-biphenylene |
| (133) | 1,3-phenylene | phenyl | 4,4'-biphenylene |
| (134) | 1,3-phenylene | phenyl | 4,4'-biphenylene |
| (135) | 1,3-phenylene | phenyl | 4,4'-biphenylene |
| (136) | 1,3-phenylene | phenyl | 4,4'-biphenylene |
| (137) | 1,4-phenylene | 1,4-phenylene | 4,4'''-quaterphenylene |
| (138) | 1,4-phenylene | 1,4-phenylene | 4,4'''-quaterphenylene |
| (139) | 1,4-phenylene | 1,4-phenylene | 4,4'''-quaterphenylene |
| (140) | 1,4-phenylene | 1,4-phenylene | 4,4'''-quaterphenylene |

TABLE 20-continued

| Compound No. | Ar₇ | Ar₈ | R₁ | R₂ | T₃ | T₄ |
|---|---|---|---|---|---|---|
| (131) | phenyl | p-phenylene | —H | —H | —CH₂CH₂CH₂— | —CH₂CH₂CH₂— |
| (132) | phenyl | p-phenylene | —H | —H | —(CH₂)₄— | —(CH₂)₄— |
| (133) | phenyl | m-phenylene | —H | —H | —CH₂— | —CH₂— |
| (134) | phenyl | m-phenylene | —H | —H | —CH₂CH₂— | —CH₂CH₂— |
| (135) | phenyl | m-phenylene | —H | —H | —CH₂CH₂CH₂— | —CH₂CH₂CH₂— |
| (136) | phenyl | m-phenylene | —H | —H | —(CH₂)₄— | —(CH₂)₄— |
| (137) | phenyl | p-phenylene | —H | —H | —CH₂— | —CH₂— |
| (138) | phenyl | p-phenylene | —H | —H | —CH₂CH₂— | —CH₂CH₂— |
| (139) | phenyl | p-phenylene | —H | —H | —CH₂CH₂CH₂— | —CH₂CH₂CH₂— |
| (140) | phenyl | p-phenylene | —H | —H | —(CH₂)₄— | —(CH₂)₄— |

TABLE 21

| Compound No. | Ar₄ | Ar₅ | Ar₆ | Ar₇ | Ar₈ |
|---|---|---|---|---|---|
| (141) | m-phenylene | p-phenylene | quaterphenylene | phenyl | m-phenylene |
| (142) | m-phenylene | p-phenylene | quaterphenylene | phenyl | m-phenylene |
| (143) | m-phenylene | p-phenylene | quaterphenylene | phenyl | m-phenylene |

TABLE 21-continued

| Compound No. | R₁ | R₂ | T₃ | T₄ |
|---|---|---|---|---|
| (141) | —H | —H | —CH₂— | —CH₂— |
| (142) | —H | —H | —CH₂CH₂— | —CH₂CH₂— |
| (143) | —H | —H | —CH₂CH₂CH₂— | —CH₂CH₂CH₂— |
| (144) | —H | —H | —(CH₂)₄— | —(CH₂)₄— |
| (145) | —H | —H | —CH₂— | —CH₂— |
| (146) | —H | —H | —CH₂CH₂— | —CH₂CH₂— |
| (147) | —H | —H | —CH₂CH₂CH₂— | —CH₂CH₂CH₂— |
| (148) | —H | —H | —(CH₂)₄— | —(CH₂)₄— |
| (149) | —H | —H | —CH₂— | —CH₂— |
| (150) | —H | —H | —CH₂CH₂— | —CH₂CH₂— |

TABLE 22

TABLE 22-continued

| Compound No. | R₁ | R₂ | T₃ | T₄ |
|---|---|---|---|---|
| (151) | —H | —H | —CH₂CH₂CH₂— | —CH₂CH₂CH₂— |
| (152) | —H | —H | —(CH₂)₄— | —(CH₂)₄— |
| (153) | —H | —H | —CH₂— | —CH₂— |
| (154) | —H | —H | —CH₂CH₂— | —CH₂CH₂— |
| (155) | —H | —H | —CH₂CH₂CH₂— | —CH₂CH₂CH₂— |
| (156) | —H | —H | —(CH₂)₄— | —(CH₂)₄— |
| (157) | —H | —H | —CH₂— | —CH₂— |
| (158) | —H | —H | —CH₂CH₂— | —CH₂CH₂— |
| (159) | —H | —H | —CH₂CH₂CH₂— | —CH₂CH₂CH₂— |
| (160) | —H | —H | —(CH₂)₄— | —(CH₂)₄— |

TABLE 23

| Compound No. | Ar₄ | Ar₅ | Ar₆ | Ar₇ | Ar₈ |
|---|---|---|---|---|---|

TABLE 23-continued

| Compound No. | R₁ | R₂ | T₃ | T₄ |
|---|---|---|---|---|
| (161) | —CH₃ | —CH₃ | —CH₂— | —CH₂— |
| (162) | —CH₃ | —CH₃ | —CH₂CH₂— | —CH₂CH₂— |
| (163) | —CH₃ | —CH₃ | —CH₂CH₂CH₂— | —CH₂CH₂CH₂— |
| (164) | —CH₃ | —CH₃ | —(CH₂)₄— | —(CH₂)₄— |
| (165) | —CN | —CN | —CH₂— | —CH₂— |
| (166) | —CN | —CN | —CH₂CH₂— | —CH₂CH₂— |
| (167) | —CN | —CN | —CH₂CH₂CH₂— | —CH₂CH₂CH₂— |
| (168) | —CN | —CN | —(CH₂)₄— | —(CH₂)₄— |
| (169) | —C₆H₅ | —C₆H₅ | —CH₂— | —CH₂— |
| (170) | —C₆H₅ | —C₆H₅ | —CH₂CH₂— | —CH₂CH₂— |

TABLE 24

| Compound No. | Ar₄ | Ar₅ | Ar₆ | Ar₇ | Ar₈ |
|---|---|---|---|---|---|
| (171) | | | | | |
| (172) | | | | | |
| (173) | | | | | |
| (174) | | | | | |

TABLE 24-continued

| Compound No. | | | | |
|---|---|---|---|---|
| (175) | 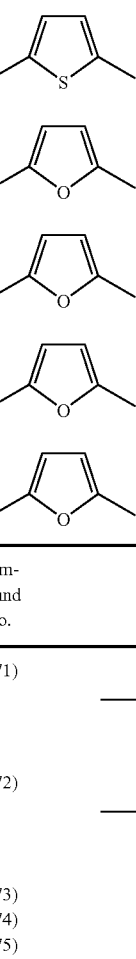 | 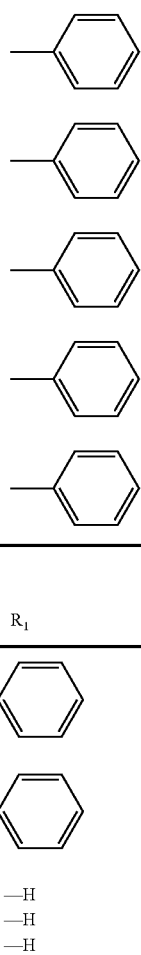 | 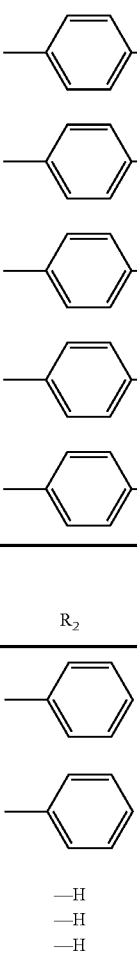 | 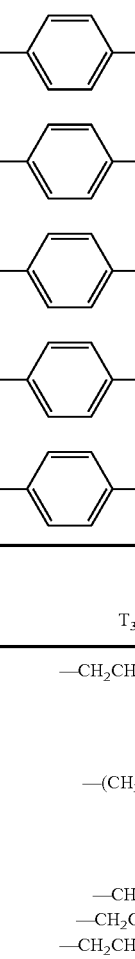 |
| (176) | 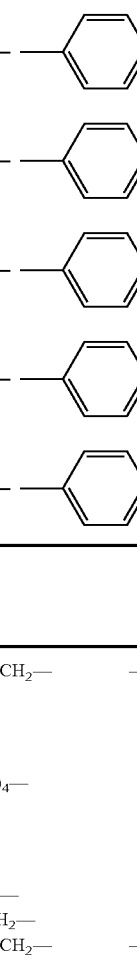 | 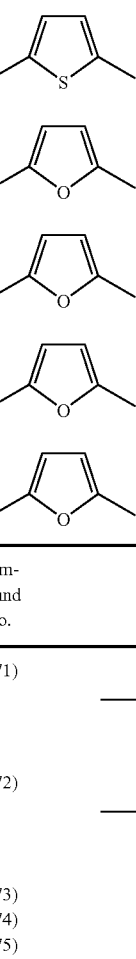 | 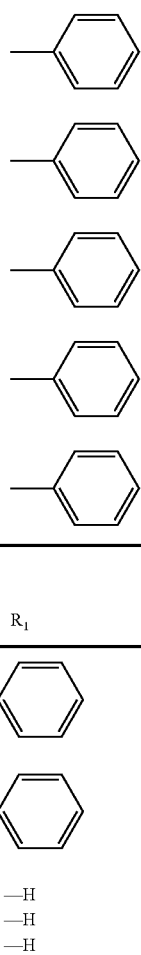 | 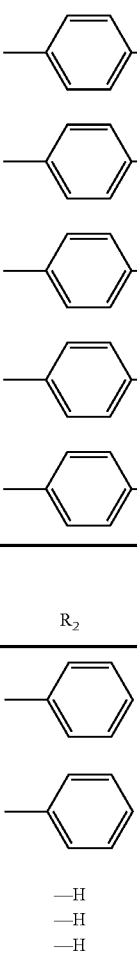 |
| (177) | 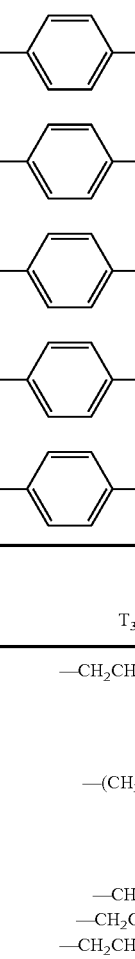 | 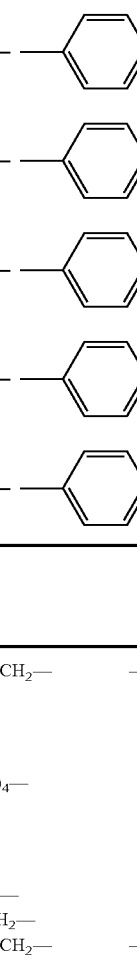 | 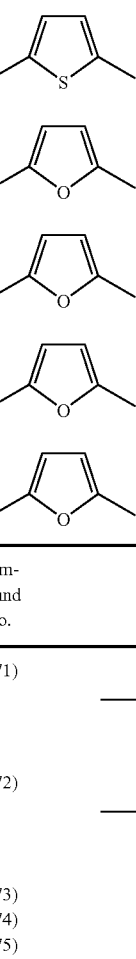 | 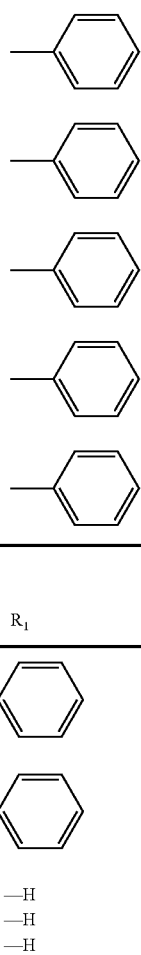 |
| (178) | 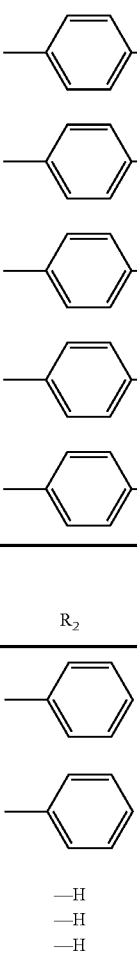 | 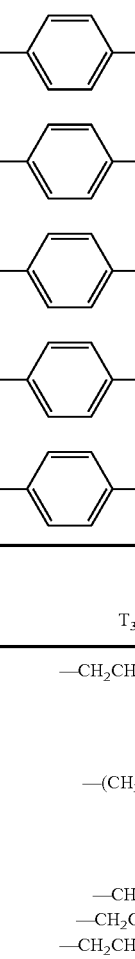 | 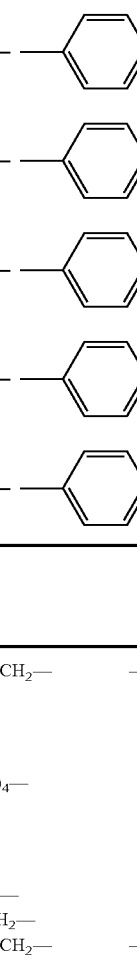 | 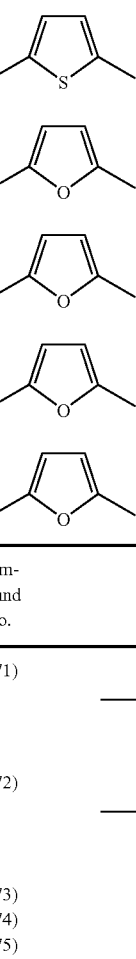 |
| (179) | 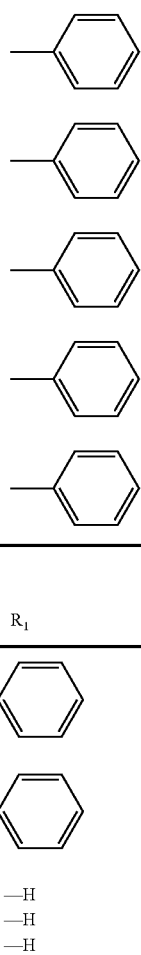 | 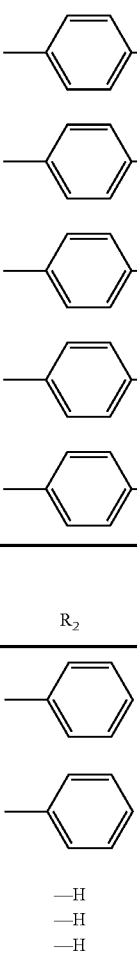 | 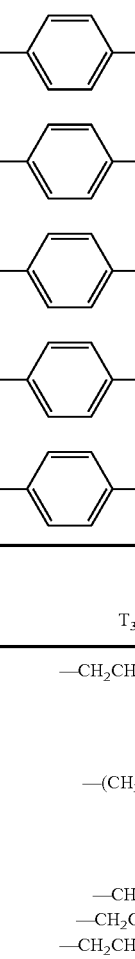 | 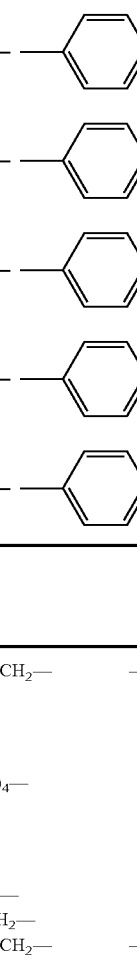 |
| (180) | 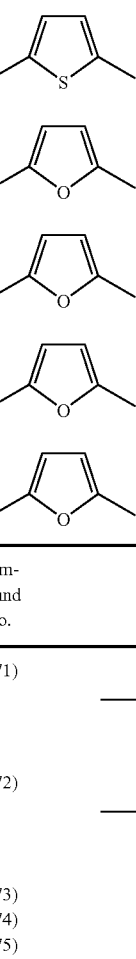 | 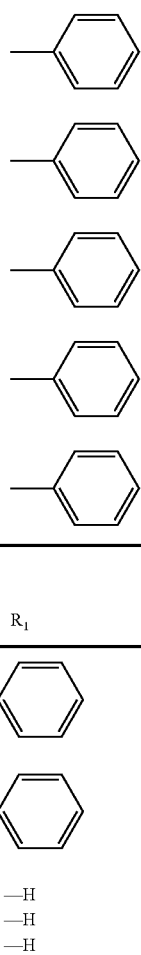 | 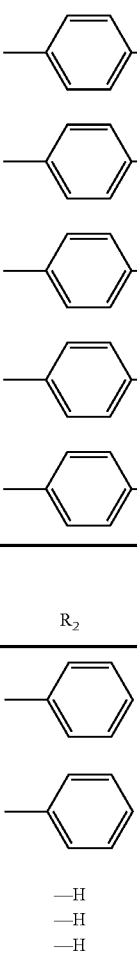 | 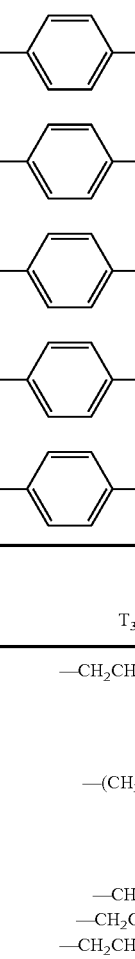 |

| Compound No. | $R_1$ | $R_2$ | $T_3$ | $T_4$ |
|---|---|---|---|---|
| (171) | 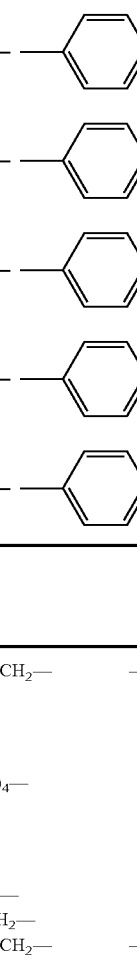 | 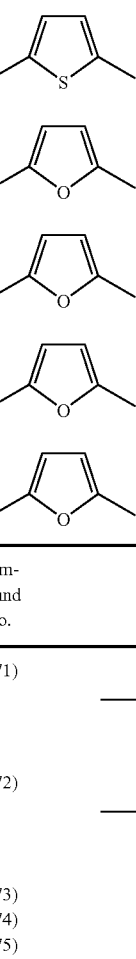 | —CH$_2$CH$_2$CH$_2$— | —CH$_2$CH$_2$CH$_2$— |
| (172) | 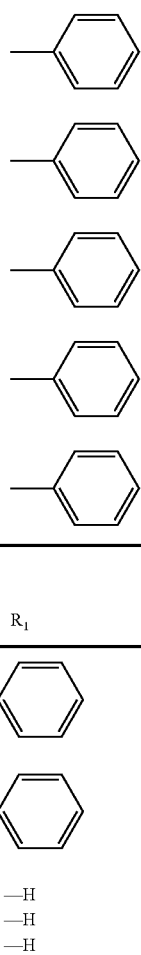 | 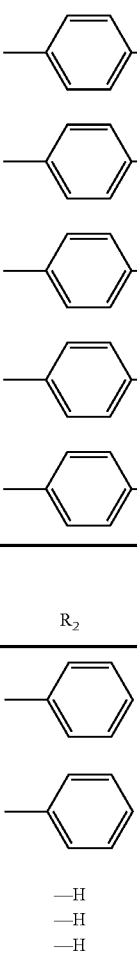 | —(CH$_2$)$_4$— | —(CH$_2$)$_4$— |
| (173) | —H | —H | —CH$_2$— | —CH$_2$— |
| (174) | —H | —H | —CH$_2$CH$_2$— | —CH$_2$CH$_2$— |
| (175) | —H | —H | —CH$_2$CH$_2$CH$_2$— | —CH$_2$CH$_2$CH$_2$— |
| (176) | —H | —H | —(CH$_2$)$_4$— | —(CH$_2$)$_4$— |
| (177) | —H | —H | —CH$_2$— | —CH$_2$— |
| (178) | —H | —H | —CH$_2$CH$_2$— | —CH$_2$CH$_2$— |
| (179) | —H | —H | —CH$_2$CH$_2$CH$_2$— | —CH$_2$CH$_2$CH$_2$— |
| (180) | —H | —H | —(CH$_2$)$_4$— | —(CH$_2$)$_4$— |

The polyester resin of the invention can be formed by polymerization of a monomer having the skeleton of formula (1) and a spacer compound or by polymerization of a monomer having the skeleton of formula (2) and a spacer compound. Specifically, if the monomer having the skeleton of formula (1) or (2) is a bisester compound, a bis-acid halide or a dicarboxylic acid compound, the spacer compound is a diol compound, and both are polymerized to form the polyester resin of the invention. On the other hand, if the monomer having the skeleton of formula (1) or (2) is a diol compound, the spacer compound is a bisester compound, a bis-acid halide or a dicarboxylic acid compound, and they are polymerized to form the polyester resin of the invention.

Specific examples of the spacer compound include a diol compound, a diester compund, a dicarboxylic acid, and a dicarboxylic acid halide each having the following skeleton.

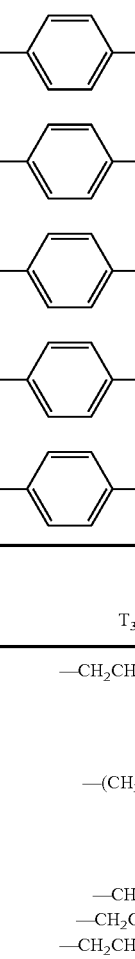
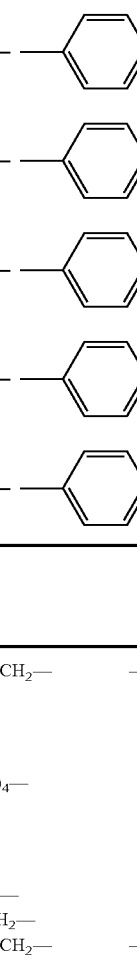
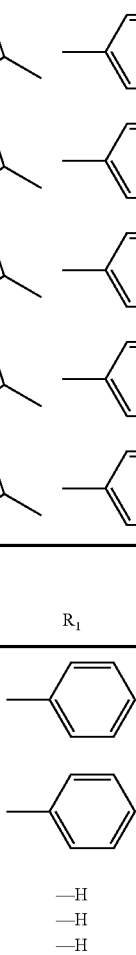
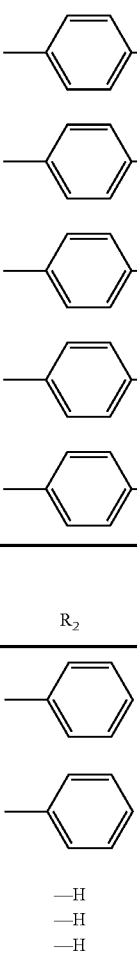
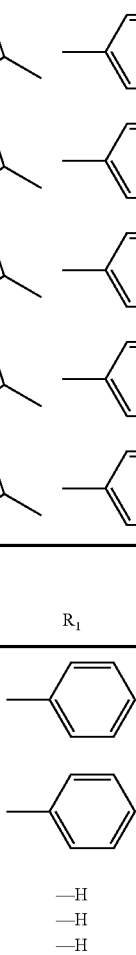
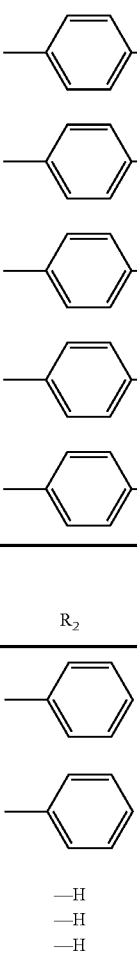

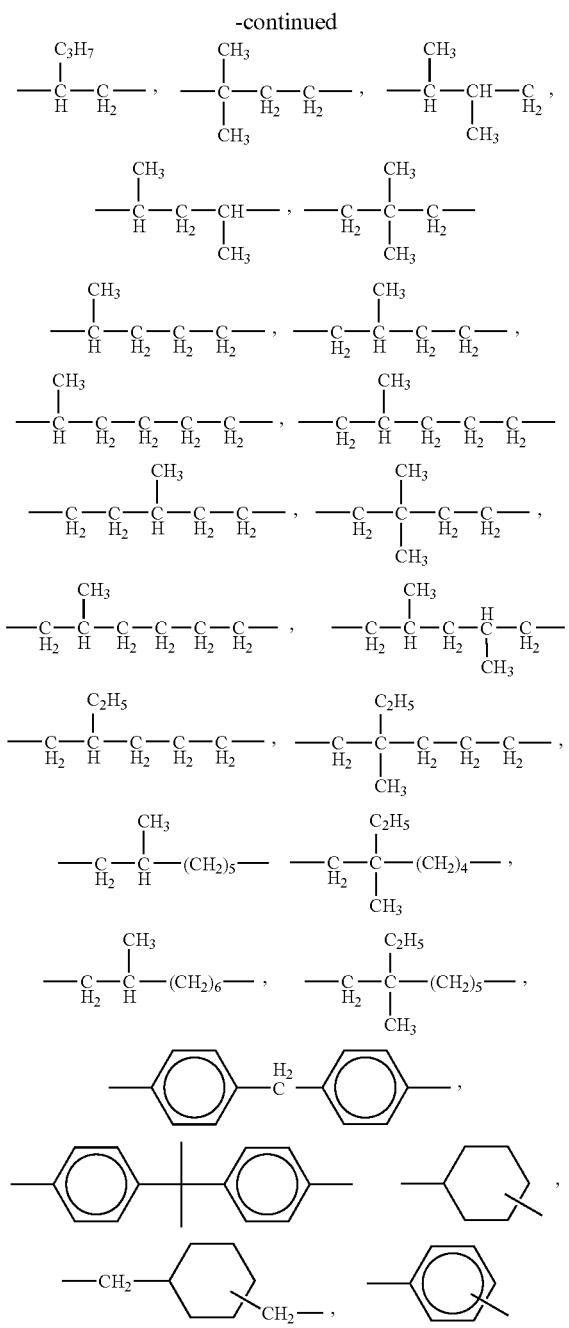

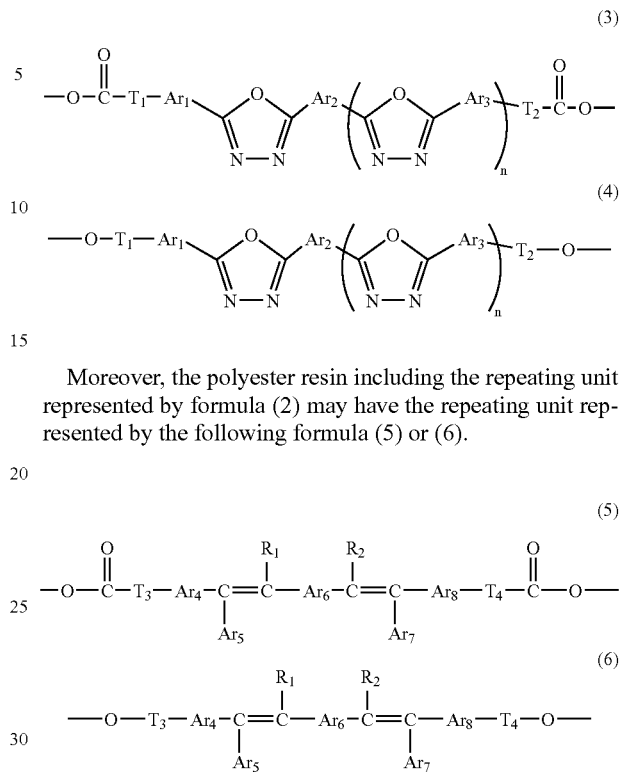

Different monomers each having the skeleton of formula (1) or (2) or spacer compounds may freely be selected, and a mixture thereof may be polymerized. The spacer compound does not necessarily have the above-described skeleton. The spacer compound may have any skeleton without limitation, as long as it can form an ester bond together with the repeating unit represented by formula (1) or (2).

If the resulting polyester resin of the invention includes, for example, the repeating unit represented by formula (1), ester bonds may be formed in the same direction at both ends of the repeating unit, or the repeating unit represented by the following formula (3) or (4) may be formed in which ester bonds are in the opposite direction at both ends.

Moreover, the polyester resin including the repeating unit represented by formula (2) may have the repeating unit represented by the following formula (5) or (6).

Alternatively, the polyester resin of the invention may be a copolymerized polyester resin including at least one repeating unit represented by formula (1) and at least one repeating unit represented by formula (2).

The copolymerization of the repeating units represented by formulae (1) and (2) can form a portion having an electron transport function and a portion having a light emitting function in the molecule as described below.

The repeating unit represented by formula (1) will be described in detail below.

The repeating unit represented by formula (1) form a structural unit having the electron transport function. In the invention, the monomer having the skeleton of formula (1) and any other compound having an electron transport function may be copolymerized for the purpose of controlling physical properties of the resulting polyester resin, such as solubility, mobility, uniformity of the coating film, and glass transition point.

Examples of the compound having the electron transport function include, but are not limited to, diols, diesters, dicarboxylic acids, and dicarboxylic acid halides of fluorenone derivatives, anthraquinodimethane derivatives, anthrone derivatives, diphenoquinone derivatives, thiopyrandioxide derivatives, carbidiimide derivatives, fluorenylidenemethane derivatives, distyrylpyrazine derivatives, perylene derivatives, and quinoxaline derivatives.

The copolymerization ratio may be represented by the mass ratio (A/B) of the mass (A) of the repeating unit represented by formula (1) to the mass (B) of the compound having the electron transport function in the copolymer. The mass ratio (A/B) is preferably in the range of from 100/1 to 1/100, and more preferably from 10/1 to 1/10.

In the invention, the monomer having the skeleton of formula (1) and any compound having a hole transport function may be copolymerized to form a molecule having a bipolar property.

Examples of the compound having the hole transport function include, but are not limited to, diols, diesters, dicarboxylic acids, and dicarboxylic acid halides of carbazole derivatives, triazole derivatives, oxazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, and oligothiophen derivatives.

The copolymerization ratio may be represented by the mass ratio (C/D) of the mass (C) of the repeating unit represented by formula (1) to the mass (D) of the compound having the hole transport function in the copolymer. The mass ratio (C/D) is preferably in the range of from 100/1 to 1/100, and more preferably from 10/1 to 1/10.

The monomer having the skeleton of formula (1) may also be copolymerized with any compound having a light emitting function.

Examples of the compound having the light emitting function include, but are not limited to, the monomers having the skeleton of formula (2), and diols, diesters, dicarboxylic acids, and dicarboxylic acid halides of benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perynone derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, and aromatic dimethylidyne compounds.

The copolymerization ratio may be represented by the mass ratio (E/F) of the mass (E) of the repeating unit represented by formula (1) to the mass (F) of the compound having the light emitting function in the copolymer. The mass ratio (E/F) is preferably in the range of from 100/1 to 1/100, and more preferably from 10/1 to 1/10.

The repeating unit represented by formula (2) will be described in detail below.

The repeating unit represented by formula (2) form a structural unit having a light emitting function. In the invention, the monomer having the skeleton of formula (2) and any other compound having an electron transport function may be copolymerized for the purpose of controlling physical properties of the resulting polyester resin, such as solubility, luminescent properties, uniformity of the coating film, and glass transition point.

Examples of the compound having the electron transport function include, but are not limited to, the monomers having the skeleton of formula (1), and diols, diesters, dicarboxylic acids, and dicarboxylic acid halides of triazole derivatives, fluorenone derivatives, anthraquinodimethane derivatives, anthrone derivatives, diphenoquinone derivatives, thiopyrandioxide derivatives, carbidiimide derivatives, fluorenylidenemethane derivatives, distyrylpyrazine derivatives, perylene derivatives, and quinoxaline derivatives.

The copolymerization ratio may be represented by the mass ratio (G/H) of the mass (G) of the repeating unit represented by formula (2) to the mass (H) of the compound having the electron transport function in the copolymer. The mass ratio (G/H) is preferably in the range of from 100/1 to 1/100, and more preferably from 10/1 to 1/10.

The monomer having the skeleton of formula (2) may also be copolymerized with any compound having a hole transport function.

Examples of the compound having the hole transport function include, but are not limited to, diols, diesters, dicarboxylic acids, and dicarboxylic acid halides of carbazole derivatives, triazole derivatives, oxazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, and oligothiophen derivatives.

The copolymerization ratio may be represented by the mass ratio (I/J) of the mass (I) of the repeating unit represented by formula (2) to the mass (J) of the compound having the hole transport function in the copolymer. The mass ratio (I/J) is preferably in the range of from 100/1 to 1/100, and more preferably from 10/1 to 1/10.

The monomer having the skeleton of formula (2) may also be copolymerized with any compound having a light emitting function.

Examples of the compound having the light emitting function include, but are not limited to, diols, diesters, dicarboxylic acids, and dicarboxylic acid halides of benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perynone derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, and styrylamine derivatives.

The copolymerization ratio may be represented by the mass ratio (K/L) of the mass (K) of the repeating unit represented by formula (2) to the mass (L) of the compound having the light emitting function in the copolymer. The mass ratio (K/L) is preferably in the range of from 100/1 to 1/100, and more preferably from 10/1 to 1/10.

In the invention, the copolymer may also be formed of the monomer having the skeleton of formula (1), the monomer having the skeleton of formula (2), the compound having the electron transport function (exclusive of the monomer having the skeleton of general formula (1)), the compound having the hole transport function, and the compound having the light emitting function (exclusive of the monomer having the skeleton of formula (2)).

In this case, the copolymerization ratio may be similar to the above except that it is represented by the mass ratio of the mass of each functional compound to the total mass of the repeating units represented by formulae (1) and (2).

The polyester resin of the invention may be synthesized by any method including, but are not limited to, transesterification of the ester compound with the diol compound, dehydrohalogenation reaction of the dicarboxylic acid halide with the diol compound, or dehydration reaction of the dicarboxylic acid compound with the diol compound.

The weight average molecular weight (Mw) of the polymer having the partial structure(s) represented by formula (1)

and/or formula (2) may depends on the type of the substituent but is preferably in the range of from 1,000 to 500,000, more preferably from 2,000 to 300,000, and still more preferably from 3,000 to 200,000.

The weight average molecular weight (Mw) is determined in terms of polystyrene by gel permeation chromatography.

The method for synthesizing the polyester resin of the invention will be described in detail below.

The polyester resin of the invention may be synthesized by the transesterification reaction of the diester compound component with the diol compound component. In such a synthesis process, an excessive amount of the diol compound component may be added to the diester compound component and the resultant mixture is heated in the presence of a catalyst such as an inorganic acid such as sulfuric acid or phosphoric acid; titanium alkoxide; an acetate or carbonate of calcium or cobalt; or an oxide of zinc or lead.

Based on one equivalent of the diester compound component, the amount of the diol compound component may be in the range of from 2 to 100 equivalents, and preferably from 3 to 50 equivalents. Based on one part by mass of the diester compound component, the amount of the catalyst may be in the range of from 1/1000 to 1 part by mass, and preferably form 1/1000 to 1/2 parts by mass. The reaction temperature may be in the range of from 100 to 300° C. For the purpose of accelerating the polymerization by elimination of the diol component, the reaction is preferably carried out under reduced pressure. In some cases, a high boiling solvent such as chloronaphthalene may be used in the reaction to form an azeotrope with the diol component under ordinary pressure.

After the reaction is completed in a solvent-free system, the product may be dissolved in a solvent. In the case where a solvent is used in the reaction, the reaction solution as formed may be added dropwise to a poor solvent such as alcohols such as methanol and ethanol; or acetone, in which the polymer is less soluble, so that the polymer is precipitated. After the polymer is separated, the polymer is sufficiently washed with water or an organic solvent and dried. If necessary, reprecipitation may be conducted once or more in which the polymer is dissolved in an appropriate organic solvent and then the resultant solution is added dropwise to the poor solvent to precipitate the polymer again. The reprecipitation process is preferably conducted while the system is being stirred efficiently with a mechanical stirrer or the like. In the reprecipitation process, one part by mass of the polymer may be dissolved in 1 to 100 parts by mass, preferably 2 to 50 parts by mass of the solvent. Based on one part by mass of the polymer, the poor solvent may be used in an amount of 1 to 1,000 parts by mass, and preferably 10 to 500 parts by mass.

The polymer may be synthesized by dehydration reaction of the dicarboxylic acid halide component with the diol compound component. In such a process, both components maybe mixed with each other in equivalent amounts and polymerized using an organic basic catalyst such as pyridine or triethylamine. Based on one equivalent of the dicarboxylic acid halide component, the amount of the catalyst may be in the range of from 1 to 10 equivalents, and preferably from 2 to 5 equivalents. Typical examples of the solvent include methylene chloride, tetrahydrofuran (THF), toluene, chlorobenzene, and 1-chloronaphthalene. Based on one part by mass of the dicarboxylic acid halide component, the solvent may be used in an amount of 1 to 100 parts by mass, and preferably 2 to 50 parts by mass. The reaction temperature may be set at any point. After the polymerization reaction, the reprecipitation may be conducted for purification.

The polymer may be synthesized by dehydration reaction of the dicarboxylic acid compound with the diol compound. In such a process, an equivalent amount of the diol compound component may be added to the dicarboxylic acid compound and polymerized using an acid catalyst. The acid catalyst may be a conventional catalyst for esterification such as sulfuric acid, toluenesulfonic acid or trifluoroacetic acid. Based on one part by mass of the dicarboxylic acid compound component, the amount of the catalyst may be in the range of from 1/10000 to 1/10 parts by mass, and preferably from 1/1000 to 1/50 parts by mass. A solvent that can form an azeotrope with water is preferably used for the purpose of removing water produced during the polymerization process. Typical examples of the solvent include toluene, chlorobenzene and 1-chloronaphthalene. Based on one part by mass of the dicarboxylic acid compound component, the solvent is used in an amount of 1 to 100 parts by mass, and preferably 2 to 50 parts by mass. The reaction temperature may be set at any point, but the reaction is preferably carried out at the boiling point of the solvent for the purse of removing water produced during the polymerization process. After the polymerization reaction, the reprecipitation may be conducted for purification.

Among the above polymerization methods, the transesterification method is more preferable, because a high-molecular weight product can easily be obtained. The monomers can be prepared as described below. The diol monomer can easily be synthesized by converting the ester monomer in the presence of a reducing catalyst such as sodium borohydride or lithium aluminum hydride in a solvent such as tetrahydrofuran or an alcohol. The dicarboxylic acid monomer can be synthesized by hydrolyzing the ester monomer with an alkali or acid in water or an alcohol. The bisacid halide monomer can be synthesized by causing a halogenating reagent such as thionyl chloride to react with the dicarboxylic acid monomer. For the synthesis of the polyester of the invention, any type of monomer may be selected from the ester and diol monomers.

<Organic Electroluminescent Device and Method for Manufacturing the Same>

The organic EL device and the method for manufacturing the same of the invention will be described in detail below.

The organic EL device of the invention has: a pair of electrodes, at least one of which is transparent or translucent, and at least one or more organic compound layer sandwiched between the electrodes, and at least one layer of the at least one organic compound layer contains the polyester of the invention.

In the organic EL device of the invention, a light emitting layer or a plurality of organic compound layers including the light emitting layer are disposed between the pair of electrodes including an anode and a cathode. In addition to the light emitting layer, the device may include a hole-injection layer, a hole transport layer, an electron-injection layer, an electron transport layer, a protective layer, and/or the like. Each of these layers may also have any other function. A variety of materials may be used in order to form the respective layers, but the at least one of the organic compound layers necessarily contains the polyester resin of the invention.

When the organic EL device of the invention has a single organic compound layer, the organic compound layer is a light emitting layer having a carrier (electron or hole) transport function, and the light emitting layer contains the polyester resin of the invention. When the organic EL device of the invention has a plurality of organic compound layers (in the case of the function separation type EL device), at least one of the layers is a light emitting layer (which may or may not have a carrier transport function), and the other layer(s) is a carrier transport layer such as a hole transport layer, an electron transport layer or a combination of the hole and electron transport layers, and at least one of the layers contains the polyester resin of the invention.

Examples of the organic EL device include an organic EL device including at least a light emitting layer and an electron transport layer, an organic EL device having at least a hole transport layer, a light emitting layer and an electron transport layer, and an organic EL device having at least a hole transport layer and a light emitting layer. At least one layer of these layers (the light emitting layer, the hole transport layer and the electron transport layer) may contain the polyester resin of the invention.

Referring to the drawings, the invention will be more specifically described below, but the organic EL device of the invention is not limited to the specific ones below.

Figure 2:
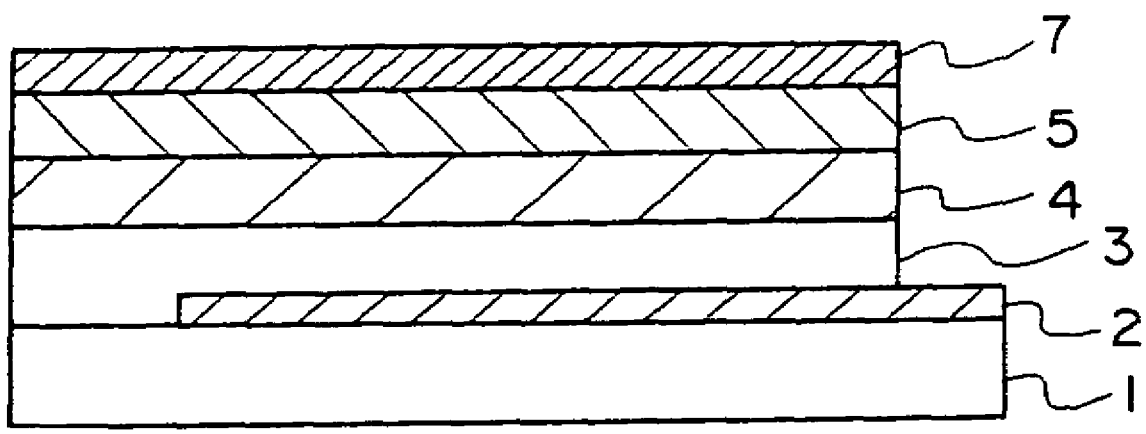
FIG. 2 is a sectional view showing another example of the organic EL device according to the invention.
Figure 3:
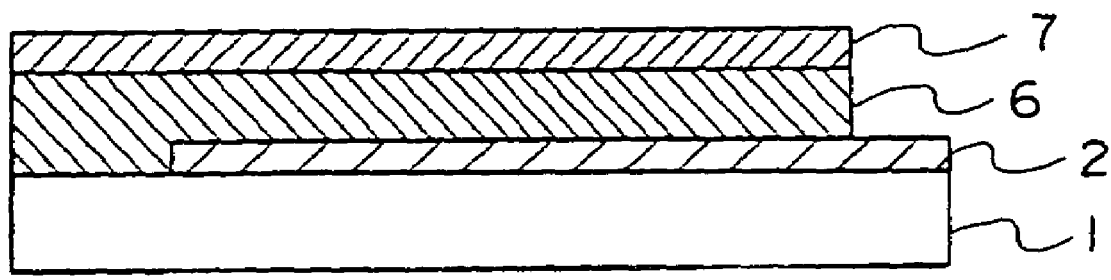
FIG. 3 is a sectional view showing still another example of the organic EL device according to the invention.
Figure 4:
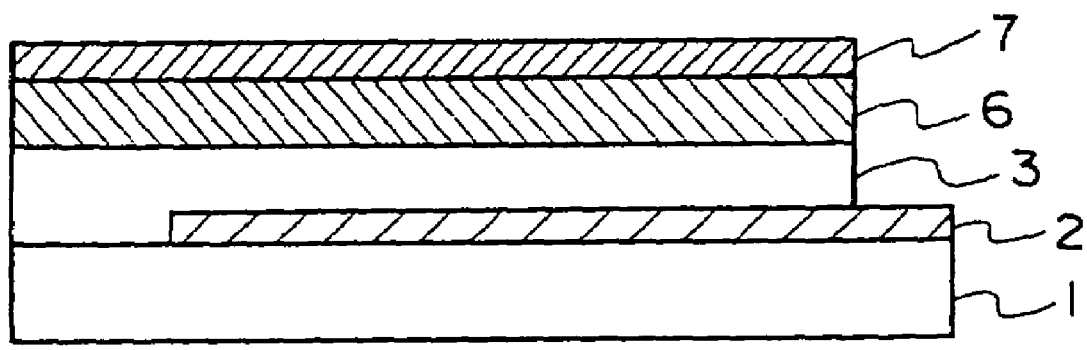
FIG. 4 is a sectional view showing still another example of the organic EL device according to the invention.

FIGS. 1 to 4 are cross-sectional views each showing the layered structure of the organic EL device of the invention. FIGS. 1, 2 and 4 each show an example of the organic EL device having a plurality of the organic compound layers, and FIG. 3 shows an example of the organic EL device having one organic compound layer. In FIGS. 1 to 4, the elements having the same function are indicated by the same reference numeral.

Referring to FIG. 1, the organic EL device includes a transparent insulator substrate 1, and a transparent electrode 2, a light emitting layer 6 having a carrier transport function, an electron transport layer 5, and a back-side electrode 7, which are sequentially stacked on the surface of the substrate 1. Referring to FIG. 2, the organic EL device includes a transparent insulator substrate 1, and a transparent electrode 2, a hole transport layer 3, a light emitting layer 4, an electron transport layer 5, and a back-side electrode 7, which are sequentially stacked on the surface of the substrate 1. Referring to FIG. 3, the organic EL device includes a transparent insulator substrate 1, and a transparent electrode 2, a light emitting layer 6 having a carrier transport function, and a back-side electrode 7, which are sequentially stacked on the surface of the substrate 1. Referring to FIG. 4, the organic EL device includes a transparent insulator substrate 1, and a transparent electrode 2, a hole transport layer 3, a light emitting layer 6 having a carrier transport function, and a back-side electrode 7, which are sequentially stacked on the surface of the substrate 1. If necessary, the organic EL device of the invention may have any other layer such as a hole-injection layer or an electron-injection layer. Each structure will be described in detail below.

The layered structure of the organic EL device as shown in each of FIGS. 1, 2 and 4 is adopted to improve durability or luminous efficiency of the device in the case where the luminescent material (the light emitting layer) used does not have clear carrier transportation properties. In the layered structure, the hole transport layer is provided between the light emitting layer 4 or the light emitting layer 6 having a carrier transport function and the transparent electrode 2, or the electron transport layer is provided between the light emitting layer 4 or the light emitting layer 6 having a carrier transport function and the back-side electrode 7.

In the layered structure of the organic EL device as shown in FIG. 1, the organic compound layer containing the polyester resin of the invention is preferably used as the electron transport layer 5 or the light emitting layer 6 having a carrier transport function. In the layered structure of the organic EL device as shown in FIG. 2, the organic compound layer containing the polyester resin may be used as any of the light emitting layer 4 and the electron transport layer 5, preferably as the light emitting layer 4. In the layered structure of the organic EL device as shown in FIG. 3, the organic compound layer containing the polyester resin is preferably used as the light emitting layer 6 having a carrier transport function. In the layered structure of the organic EL device as shown in FIG. 4, the organic compound layer containing the polyester resin may be used as the light emitting layer 6 having a carrier transport function, and such use is preferable in terms of cost, because the number of the process steps can significantly be reduced.

Among the above layered structures, the structures as shown in FIGS. 1 and 4 are preferable as the organic EL device including the organic compound layer of the polyester resin of the invention. This is because the device can easily be manufactured, the properties of the polyester resin of the invention is effective, and sufficient brightness, stability and durability can be achieved.

The electrodes, the material for each layer and the manufacturing process will be described below. According to the invention, the method of manufacturing the organic electroluminescent device includes the steps of: forming at least one organic compound layer on the surface of an electrode; and forming a counter electrode on the surface of the at least one organic compound layer, wherein at least one layer of the at least one organic compound layer is formed so as to include at least one kind of the polyester resins of the invention in the step of forming the at least one organic compound layer.

The anode (transparent electrode 2), which supplies holes to the hole-injection layer, the hole transport layer, the light emitting layer, or the like, may be made of metal, alloy, metal oxide, an electrically conductive compound, or a combination thereof and preferably made of a material having a work function of 4 eV or more.

Examples of the anode material include an electrically conductive metal oxide such as tin oxide, zinc oxide, indium oxide, or indium tin oxide (ITO); a metal such as gold, silver, chromium, or nickel; a mixture or laminate of the metal and the electrically conductive metal oxide; an electrically conductive inorganic material such as copper iodide or copper sulfide; an electrically conductive organic material such as polyaniline, polythiophene or polypyrrole; and a laminate of ITO and any of these materials. The electrically conductive metal oxide is preferable, and ITO is particularly preferable in terms of productivity, high conductivity, transparency, and the like.

The thickness of the anode may be appropriately set at any level in accordance with the material and is preferably in the range of from 10 nm to 5 μm, more preferably from 50 nm to 1 μm, and still more preferably from 100 nm to 500 nm.

The anode is generally formed as a layer on the surface of a substrate such as a soda-lime glass, an alkali-free glass or a transparent resin substrate. If the substrate (transparent insulator substrate 1) is made of glass, the alkali-free glass is preferably used so that the amount of ions eluting from the glass can be reduced. If the substrate is made of the soda-lime glass, the substrate is preferably provided with a barrier coat such as silica. The thickness of the substrate is not particularly limited as long as it is sufficient to maintain mechanical strength and, when glass is used, is generally 0.2 mm or more, and preferably 0.7 mm or more.

The anode may be formed by any method in accordance with the material. For example, an ITO electrode film may be formed by an electron beam method, a sputtering method, a resistance heating vapor deposition process, a chemical reaction process (sol-gel process), or coating of an indium tin oxide dispersion. The anode may be washed or subjected to any other process for the purpose of reducing the driving voltage of the device or increasing the luminous efficiency of the device. For example, a UV-ozone treatment or plasma treatment is effective on the ITO.

The material for the cathode (back-side electrode 7), which supplies electrons to the electron-injection layer, the electron transport layer, the light emitting layer, or the like, is selected in view of adhesion to the adjacent layer such as the electron-injection layer, the electron transport layer or the light emitting layer, ionization potential, stability, and the like.

The material for the cathode may be metal, alloy, metal halide, metal oxide, an electrically conductive compound, or a combination thereof. Examples of the material include alkali metals (such as Li, Na and K) and fluorides thereof; alkaline earth metals (such as Mg and Ca) and fluorides thereof; gold, silver, lead, aluminum, sodium-potassium alloys, and a metal mixture thereof; lithium-aluminum alloys or a metal mixture thereof; magnesium-silver alloys or a metal mixture thereof; and rare earth metals such as indium and ytterbium. Preferred materials have a work function of 4 eV or less, and more preferred materials include aluminum, lithium-aluminum alloys and a metal mixture thereof, and magnesium-silver alloys and a metal mixture thereof.

The cathode may have a monolayer structure of the above compound or a mixture thereof or a laminate structure of the above compounds or mixtures thereof. The film thickness of the cathode may be appropriately set at any level in accordance with the material and is preferably in the range of from 10 nm to 5 µm, more preferably from 50 nm to 1 µm, and still more preferably from 100 nm to 1 µm.

The cathode may be formed by an electron beam method, a sputtering method, a resistance heating vapor deposition process, or a coating method. A metal may be vapor-deposited, or two or more components may simultaneously be vapor-deposited. Different metals may also be simultaneously vapor-deposited to form an alloy electrode. Alternatively, a previously prepared alloy may be vapor-deposited. The counter electrode can be formed as described above.

The anode and the cathode preferably have a low sheet resistance, which is preferably several hundred $\Omega/cm^2$ or less.

The organic compound layer formed on the surface of the electrode (the process of forming at least one organic compound layer) will be described below. Each organic compound layer containing the polyester resin of the invention may be formed by any method such as resistance heating vapor deposition, an electron beam method, sputtering, a molecular layering method, or a coating method. The resistance heating vapor deposition and the coating method are preferable in view of characteristics and productivity of the device. The coating method is particularly preferable to form the organic compound layer containing the polyester resin of the invention.

The light emitting layer 4 may be made of any material that can form a layer having a function of injecting holes from the anode, the hole-injection layer or the hole transport layer 3 under an applied electric field and a function of injecting electrons from the cathode, the electron-injection layer or the electron transport layer 5, a function of shifting the injected charge or providing a place for recombination of holes and electrons for emission. Any other luminescent material may be used in addition to the polyester resin of the invention.

Examples of any other material include metal complexes such as metal or rare earth element complexes of benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perynone derivatives, oxadiazole derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, aromatic dimethylidyne compounds, or 8-quinolinol derivatives; and polymer compounds such as polythiophene, polyphenylene and polyphenylenevinylene.

One of the above compounds may be used alone, or two or more of the above compounds may be used in combination. The addition amount of any other luminescent material is preferably 0.1 to 90% by mass, and more preferably 1 to 50% by mass, based on the total mass of the whole layer.

The thickness of the light emitting layer 4 is not particularly limited but, in general, is preferably in the range of from 1 nm to 5 µm, more preferably from 5 nm to 1 µm, and still more preferably from 10 nm to 500 nm.

The light emitting layer 4 may be formed by any method such as resistance heating vapor deposition, an electron beam method, sputtering, a molecular layering method, a coating method (such as spin coating, casting and dip coating), or an LB method. The resistance heating vapor deposition and the coating method are preferably used.

The hole-injection layer and the hole transport layer 3 may be made of any material that has any of a function of injecting holes from the anode, a function of transporting holes and a function of blocking the electrons injected from the cathode.

Examples of such a material include electrically conductive polymers or oligomers such as carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, thiophene oligomers, and polythiophene.

One of the above compounds may be used alone, or two or more of the above compounds may be used in combination.

The film thickness of the hole-injection layer or the hole transport layer 3 is not particularly limited but, in general, is preferably in the range of from 1 nm to 5 µm, more preferably from 5 nm to 1 µm, and still more preferably from 10 nm to 500 nm. The hole-injection layer or the hole transport layer 3 may have a monolayer structure of at least one of the above materials or have a multilayer structure including a plurality of layers having the same or different compositions.

The hole-injection layer or the hole transport layer 3 may be formed by a vacuum evaporation method, an LB method, or a process of coating a solvent or dispersion of the hole-injection or transport agent (such as spin coating, casting and dip coating). In the coating process, the agent may be dissolved or dispersed in a solvent together with a resin component. Examples of the resin component include polyvinyl chloride, polycarbonate, polystyrene, polymethyl methacrylate, polybutyl methacrylate, polyester, polysulfon, polyphenylene oxide, polybutadiene, poly(N-vinylcarbazole), hydrocarbon resins, ketone resins, phenoxy resins, polyamide, ethylcellulose, polyvinyl acetate, ABS resins, polyurethane, melamine resins, unsaturated polyester resins, alkyd resins, epoxy resins, and silicone resins.

The electron-injection layer and the electron transport layer 5 may be made of any material that has any of a function of injecting electrons from the cathode, a function of transporting electrons and a function of blocking the holes injected from the anode.

Specific examples of such a material include the polyester resin of the invention; and heterocyclic tetracarboxylic acid anhydrides such as triazole derivatives, oxazole derivatives, fluorenone derivatives, anthraquinodimethane derivatives, anthrone derivatives, diphenylquinone derivatives, thiopyrandioxide derivatives, carbidiimide derivatives, fluorenylidenemethane derivatives, distyrylpyrazine derivatives, and naphthaleneperylene; and metal complexes such as metal complexes of phthalocyanine derivatives or 8-quinolinol derivatives and metal phthalocyanine and metal complexes having, as a ligand, benzoxazole or benzothiazole.

One of the above compounds may be used alone, or two or more of the above compounds may be used in combination. The addition amount of any other material in the polyester resin of the invention is preferably 0.1 to 90% by mass, and more preferably 1 to 50% by mass, based on the total mass of the whole layer.

The thickness of the electron-injection layer or the electron transport layer 5 is not particularly limited but is preferably in the range of from 1 nm to 5 μm, more preferably from 5 nm to 1 μm, and still more preferably from 10 nm to 500 nm. The electron-injection layer or the electron transport layer 5 may have a monolayer structure of at least one of the above materials or have a multilayer structure including a plurality of layers having the same or different compositions.

The electron-injection layer or the electron transport layer 5 maybe formed by a vacuum evaporation method, an LB method, or a process of coating a solution or dispersion of the electron-injection or transport agent (such as spin coating, casting and dip coating). In the coating process, the agent may be dissolved or dispersed in a solvent together with a resin component. Examples of the resin component may be the same as those for use in the hole-injection or transport layer.

Each of the above-described materials (the polyester resin, the luminescent material or the like) may be dispersed in a solvent in the form of molecules or fine particles. In the coating process using a coating solution, the dispersion solvent should be common to the respective materials. The dispersion solvent for making a fine particle dispersion should be selected in view of dispersibility and solubility of the above materials. The fine particle dispersion can be prepared with a ball mill, a sand mill, a paint shaker, an attritor, a homogenizer, a supersonic method, or the like.

In the invention, a protective layer may be provided if necessary. The protective layer may be made of any material that has a function of blocking device degradation promoting substances such as water and oxygen from entering the device.

Examples of such a material include metals such as In, Sn, Pb, Au, Cu, Ag, Al, Ti, and Ni, metal oxides such as MgO, SiO, $SiO_2$, $Al_2O_3$, GeO, NiO, CaO, BaO, $Fe_2O_3$, $Y_2O_3$, and $TiO_2$, metal fluorides such as $MgF_2$, LiF, $AlF_3$, and $CaF_2$, polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorodifluoroethylene, copolymers formed by copolymerization of a monomer mixture including tetrafluoroethylene and at least one comonomer, fluorine-containing copolymers having a cyclic structure in a copolymerized main chain, water absorbing substances with a water absorption percentage of 1% or more, and moisture-proof substances with a water absorbing percentage of 0.1% or less.

The protective layer may be formed by any method such as a vacuum evaporation process, a sputtering method, a reactive sputtering method, an MBE (molecular beam epitaxy) method, a cluster ion beam method, an ion plating method, a plasma polymerization method (a radiofrequency excited ion plating method), a plasma CVD method, a laser CVD method, a thermal CVD method, a gas source CVD method, or a coating method.

<Functional Devices>

According to the invention, the functional device includes at least one kind of the polyester resins of the invention.

The functional device is typically the above organic EL device. The material may also be used for an electron transport layer and/or an underlying layer of an organic photoconductor (OPC), an organic laser diode (OLD), or the like.

As described above, the polyester resin of the invention has a good electron transport function or a good light emitting function and a good film forming property and a good coating film stabilizing property and therefore can be widely used in electronic or optical functional devices that are required to have a large area and durability.

EXAMPLES

The present invention will be described by way of the following examples, but the examples are not intended to limit the scope of the invention.

Synthesis examples of the polyester resin of the invention including the polyester resins used in the respective examples are shown below.

Synthesis of Polyester Resins

Synthesis Example 1

Resin Having the Repeating Unit of Illustrative Compound (2)

A flask having a nominal volume of 100 ml is charged with 5 g of methyl ester monomer (A) having the following structure, 15 g of ethylene glycol and 50 mg of tetrabutoxy titanium and the resultant mixture is heated and refluxed for 3 hours under a stream of nitrogen. The internal pressure of the flask is then reduced to 66.7 Pa, and the ethylene glycol is slowly removed by distillation. Under the reduced pressure, the polymerization is accelerated at 200° C. for 3 hours, and then, the resultant reaction system is cooled to room temperature. The system is dissolved in 20 ml of 1,3-dimethyl-2-imidazolidinone, and then insoluble materials are filtered out with a PTFE filter having a pore size of 0.5 μm. 200 ml of methanol is added dropwise to the resultant resin solution while the resin solution is being stirred to precipitate the polymer.

The resulting polymer is separated by filtration, sufficiently washed with methanol and dissolved in 20 ml of chloroform. The polymer solution is added dropwise to 200 ml of methanol and precipitated again. The resulting polymer is separated by filtration, sufficiently washed with methanol and dried. 4.1 g of polyester resin (P-1) having the following structure is thus obtained.

The weight average molecular weight (Mw) of polyester resin (P-1) is measured and found to be $7.6 \times 10^4$ (in terms of styrene). The resulting polyester (P-1) has an IR spectrum as shown in FIG. 2.

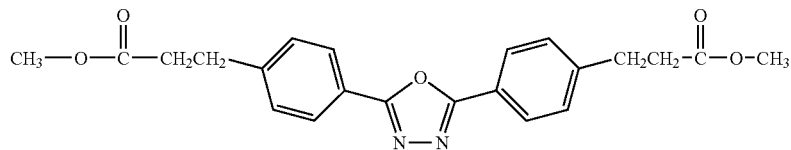

Monomer (A)
mp. 139 ~ 140.5° C.

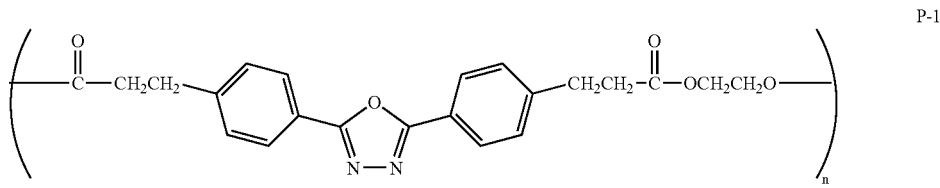

P-1

Synthesis Example 2

Resin Having the Repeating Unit of Illustrative Compound (6)

The same process as in Synthesis Example 1 is conducted except that 5 g of monomer (B) having the following structure is used in place of monomer (A). As a result, 3.9 g of polyester resin (P-2) as shown below is obtained.

The weight average molecular weight (Mw) of polyester resin (P-2) is measured and found to be $8.1 \times 10^4$ (in terms of styrene). The resulting polyester (P-2) has an IR spectrum as shown in FIG. 3.

and refluxed for 3 hours under a stream of nitrogen. The internal pressure of the flask is then reduced to 66.7 Pa, and the ethylene glycol is slowly removed by distillation. Under the reduced pressure, the polymerization is carried out at 200° C. for 4 hours, and then, the resultant reaction system is cooled to room temperature. The system is dissolved in 40 ml of methylene chloride, and then insoluble materials are filtered out with a PTFE filter having a pore size of 0.5 μm. The resultant resin solution is added dropwise to 400 ml of methanol which is being stirred to precipitate the resultant polymer.

The resulting polymer is separated by filtration, sufficiently washed with methanol and dissolved in 20 ml of methylene chloride. The resin solution is added dropwise to

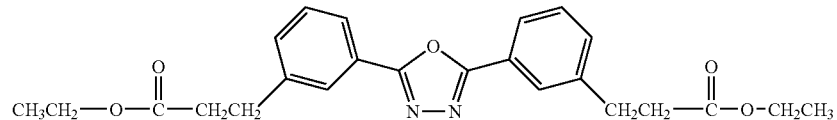

Monomer (B)
mp. 67 ~ 69 C.

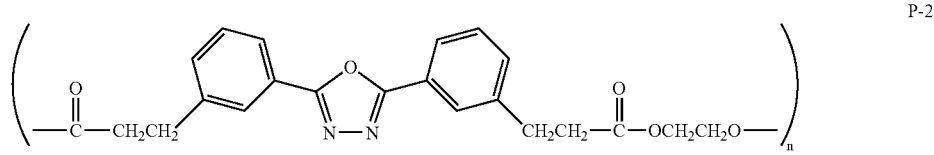

P-2

Synthesis Example 3

Copolymer of Compound (C) Having Hole Transport Property

A flask having a nominal volume of 100 ml is charged with 4 g of methyl ester monomer (A) as shown above, 1 g of ester monomer (C) as shown below, 15 g of ethylene glycol, and 50 mg of tetrabutoxy titanium and the resultant mixture is heated 200 ml of methanol which is being stirred so that the polymer is precipitated again. The resulting polymer is separated by filtration, sufficiently washed with methanol and dried. 3.5 g of copolymerized polyester resin (P-3) having the following structure is thus obtained.

The weight average molecular weight (Mw) of copolymerized polyester resin (P-3) is measured and found to be $5.3 \times 10^4$ (in terms of styrene). The resulting random copolymer polyester resin (P-3) has an IR spectrum as shown in FIG. 4.

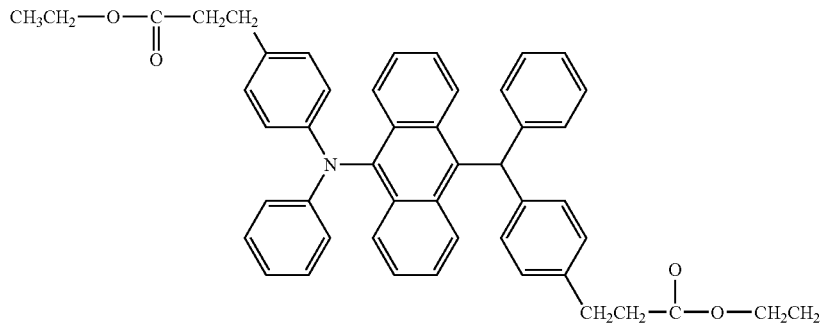

Monomer (C)
mp. 168 ~ 170° C.

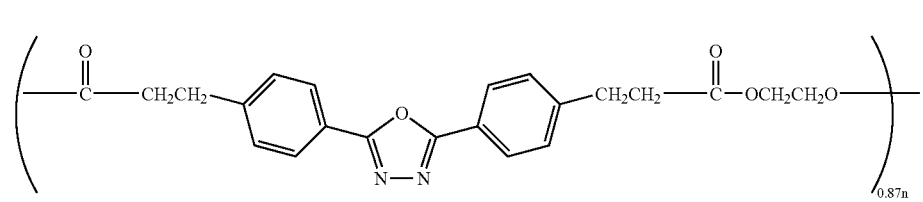

P-3

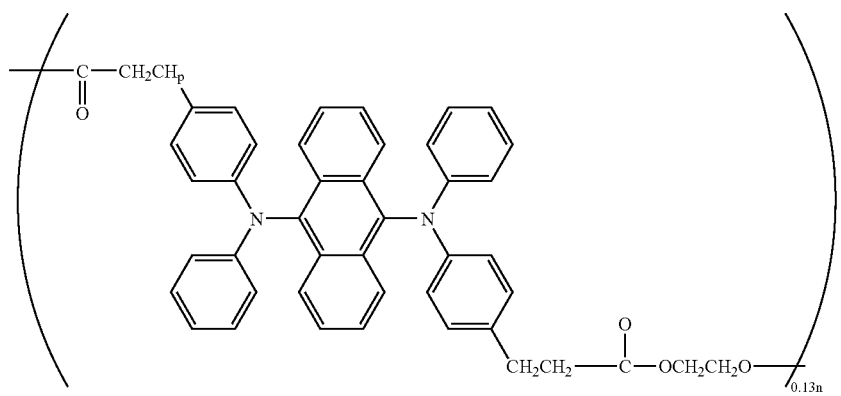

Synthesis Example 4

Copolymer of Compound (D) Having Hole Transport Property

The same process as in Synthesis Example 3 is conducted except that 3.5 g of monomer (B) is used in place of 4 g of monomer (A) and that 1.5 g of ester monomer (D) as shown below is used in place of 1 g of monomer (C). As a result, 4.0 g of copolymerized polyester resin (P-4) is obtained.

Figure 5:
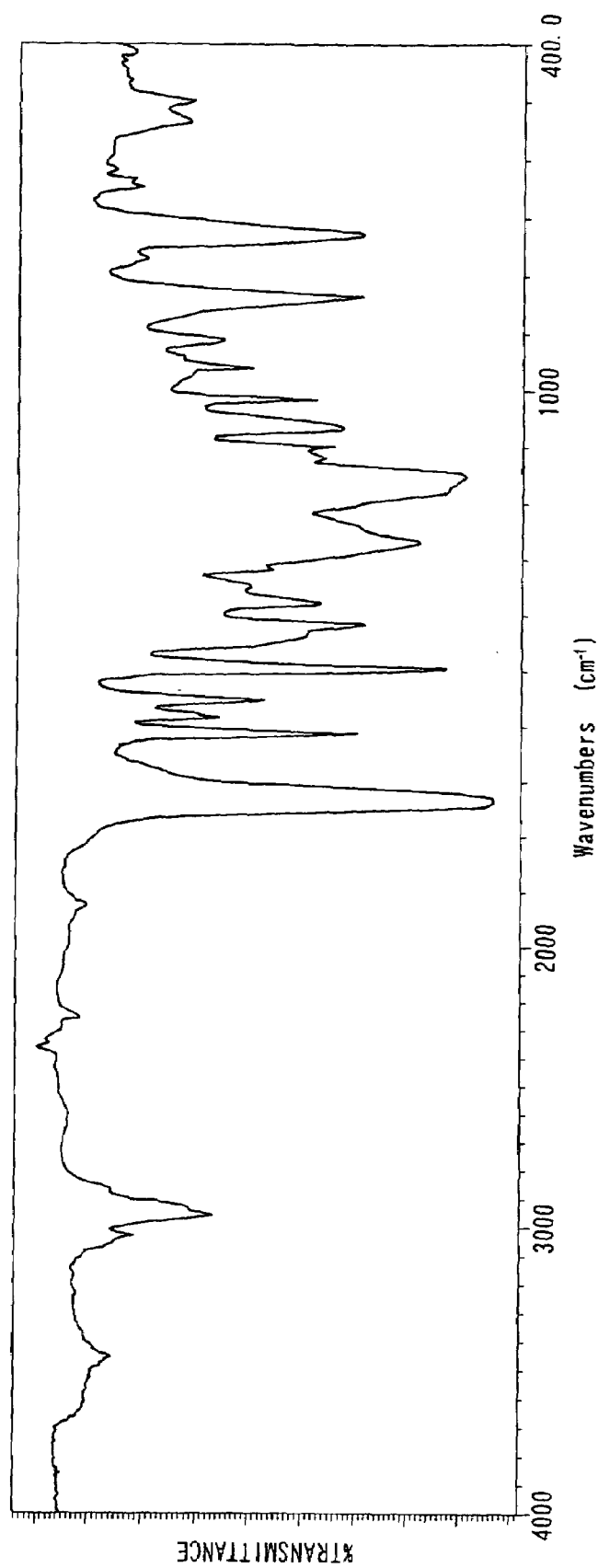
FIG. 5 is a chart showing the IR spectrum of an polyester resin according to the invention.

The weight average molecular weight (Mw) of copolymerized polyester resin (P-4) is measured and found to be $4.2 \times 10^4$ (in terms of styrene). The resulting random copolymer polyester (P-4) has an IR spectrum as shown in FIG. 5.

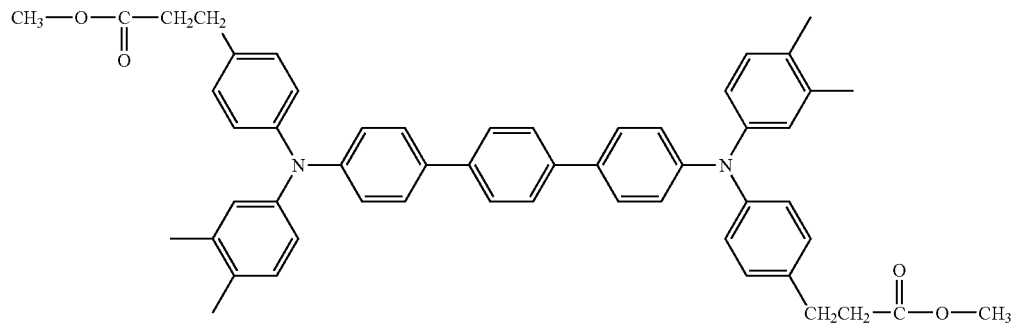

Monomer (D)
mp. 146.5 ~ 147.5° C.

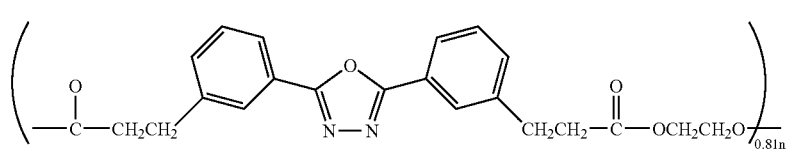

P-4

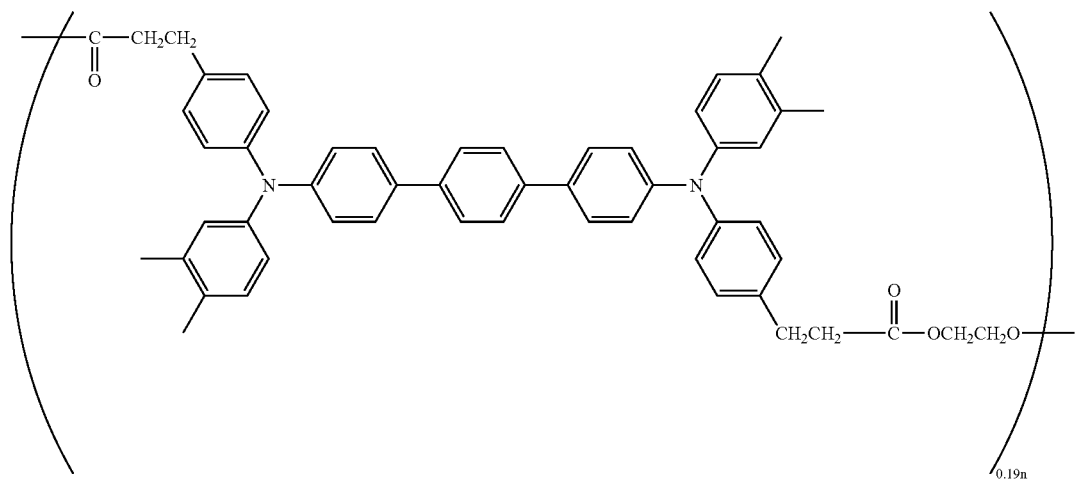

Synthesis Example 5

Copolymer of Compound (E) Having Light Emitting Function

The same process as in Synthesis Example 3 is conducted except that 2.5 g of monomer (B) is used in place of 4 g of monomer (A) and that 2.5 g of ester monomer (E) (light yellow oily matter) as shown below is used in place of 1 g of monomer (C). As a result, 4.3 g of copolymerized polyester resin (P-5) is obtained.

Figure 6:
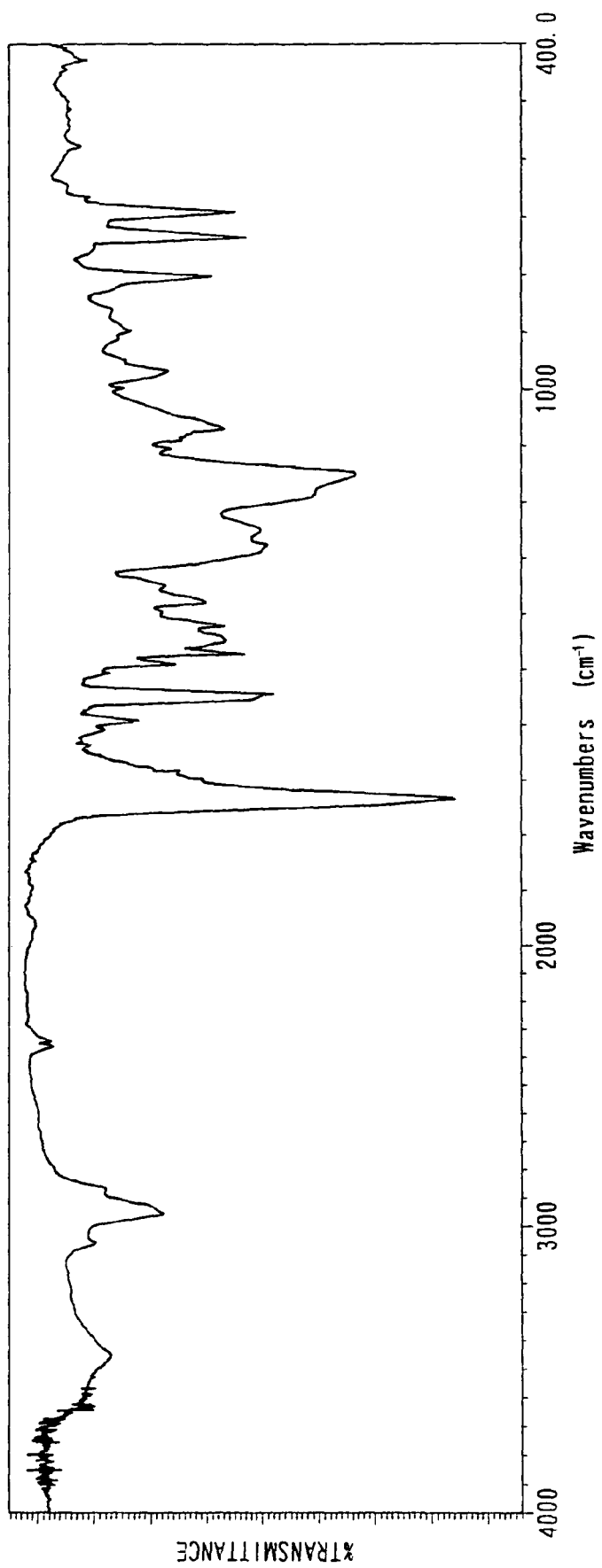
FIG. 6 is a chart showing the IR spectrum of another polyester resin according to the invention.

The weight average molecular weight (Mw) of copolymerized polyester resin (P-5) is measured and found to be $6.6 \times 10^4$ (in terms of styrene). The resulting random copolymer polyester resin (P-5) has an IR spectrum as shown in FIG. 6.

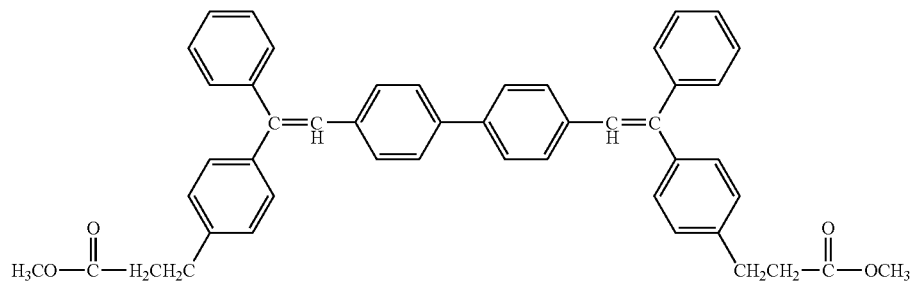

Monomer (E)

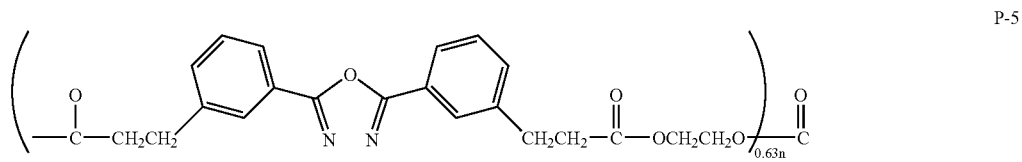

P-5

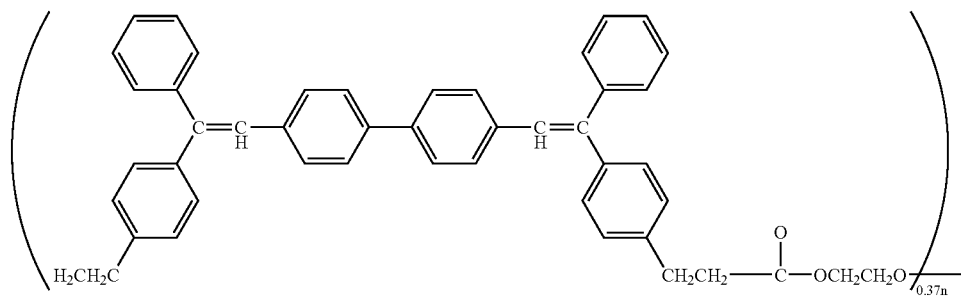

Synthesis Example 6

Copolymer of Compound (E) Having Light Emitting Function and Monomer (F)

A flask having a nominal volume of 100 ml is charged with 0.1 g of monomer (E) as shown above, 3.5 g of dimethyl succinate 3 g of ethylene glycol, and 7 g of diol monomer (F) as shown below and the monomers are caused to react at 170° C. for 3.5 hours under a stream of nitrogen, and then the resultant reaction system is cooled to room temperature.

While the temperature is being raised to 230° C., the excessive ethylene glycol is then slowly removed by distillation under a reduced pressure of 113.3 Pa. Under the same reduced pressure, the mixture is kept at 230° C. and caused to react for 5 hours, and then cooled to room temperature. The system is dissolved in 50 ml of tetrahydrofuran (THF), and then insoluble materials are filtered out with a PTFE filter having a pore size of 0.5 μm. The resultant polymer solution is added dropwise to 500 ml of n-hexane which is being stirred to precipitate the resultant polymer. 5.4 g of random copolymer polyester resin (P-6) as shown below is thus obtained.

Figure 7:
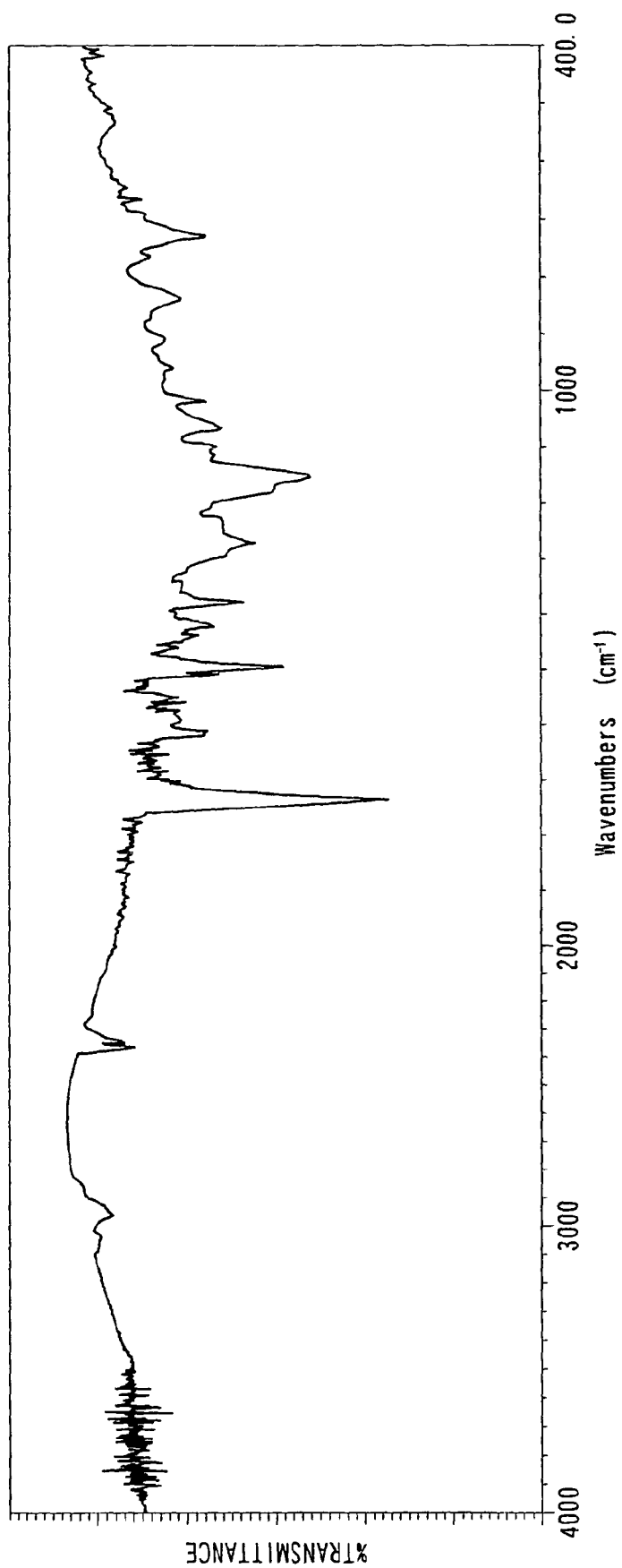
FIG. 7 is a chart showing the IR spectrum of a still another polyester resin according to the invention.

The weight average molecular weight (Mw) of copolymerized polyester resin (P-6) is measured and found to be $5.5 \times 10^4$ (in terms of styrene). The resulting random copolymer polyester resin (P-6) has an IR spectrum as shown in FIG. 7.

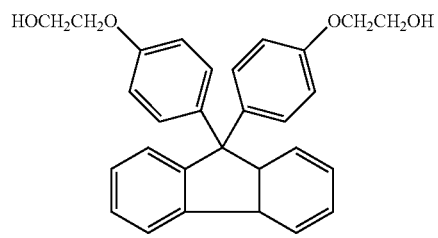

Monomer (F)

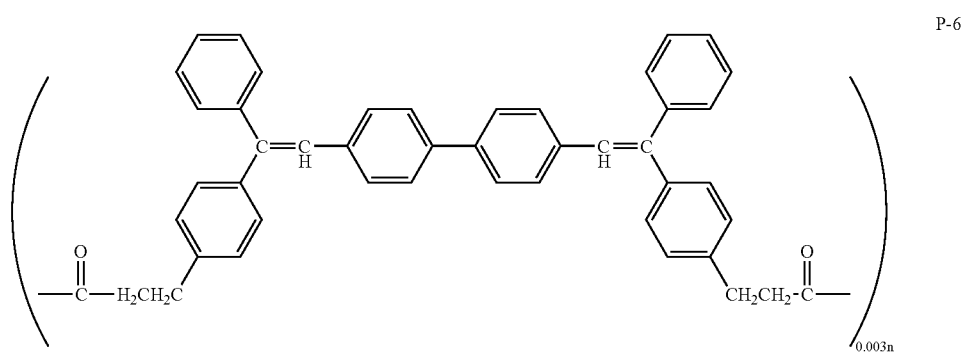

P-6

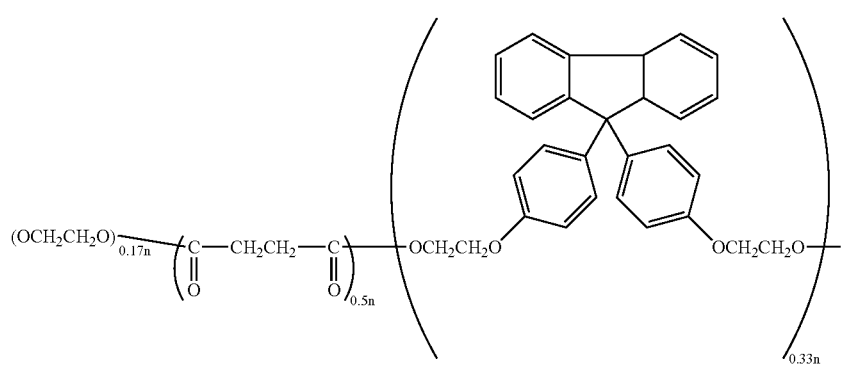

Synthesis Example 7

Resin Having the Repeating Unit of Illustrative Compound (130)

The same process as in Synthesis Example 1 is conducted except that 5 g of monomer (E) is used in place of 5 g of monomer (A). As a result, 4.4 g of polyester resin (P-7) as shown below is obtained.

Figure 8:
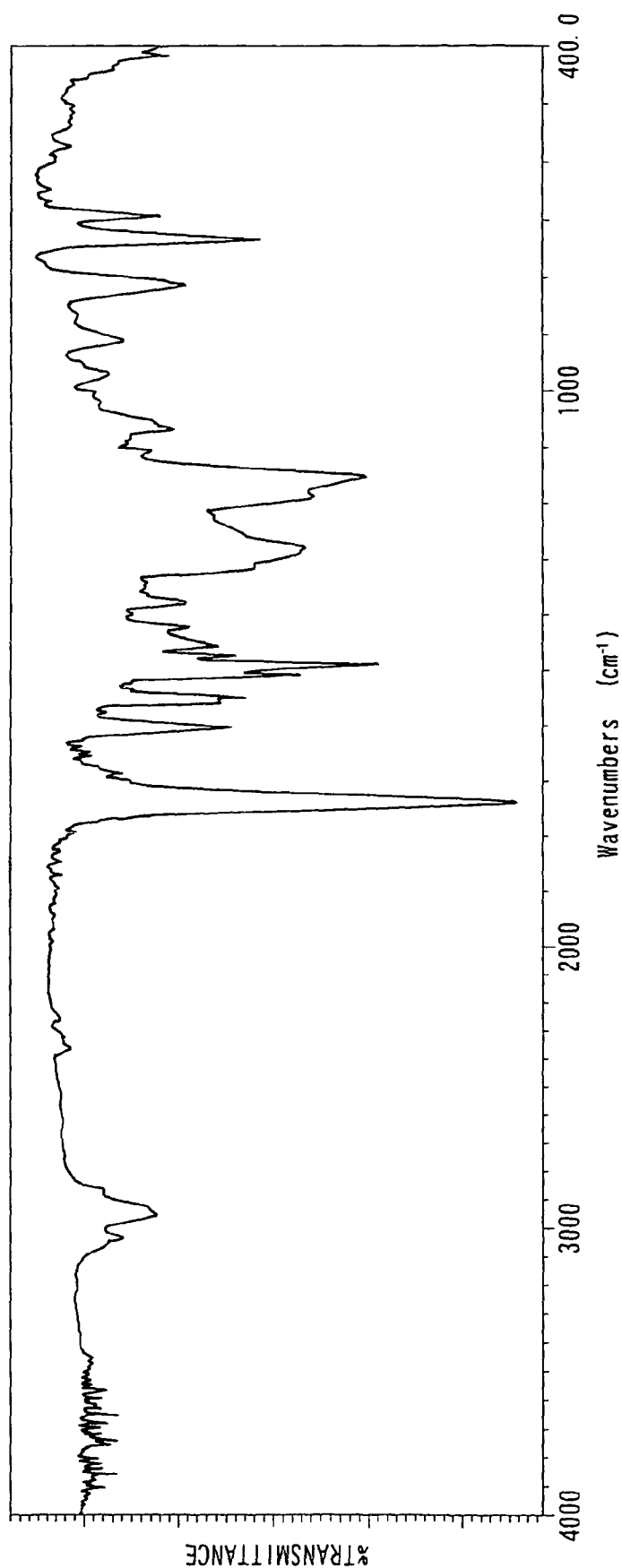
FIG. 8 is a chart showing the IR spectrum of a still another polyester resin according to the invention.
Figure 9:
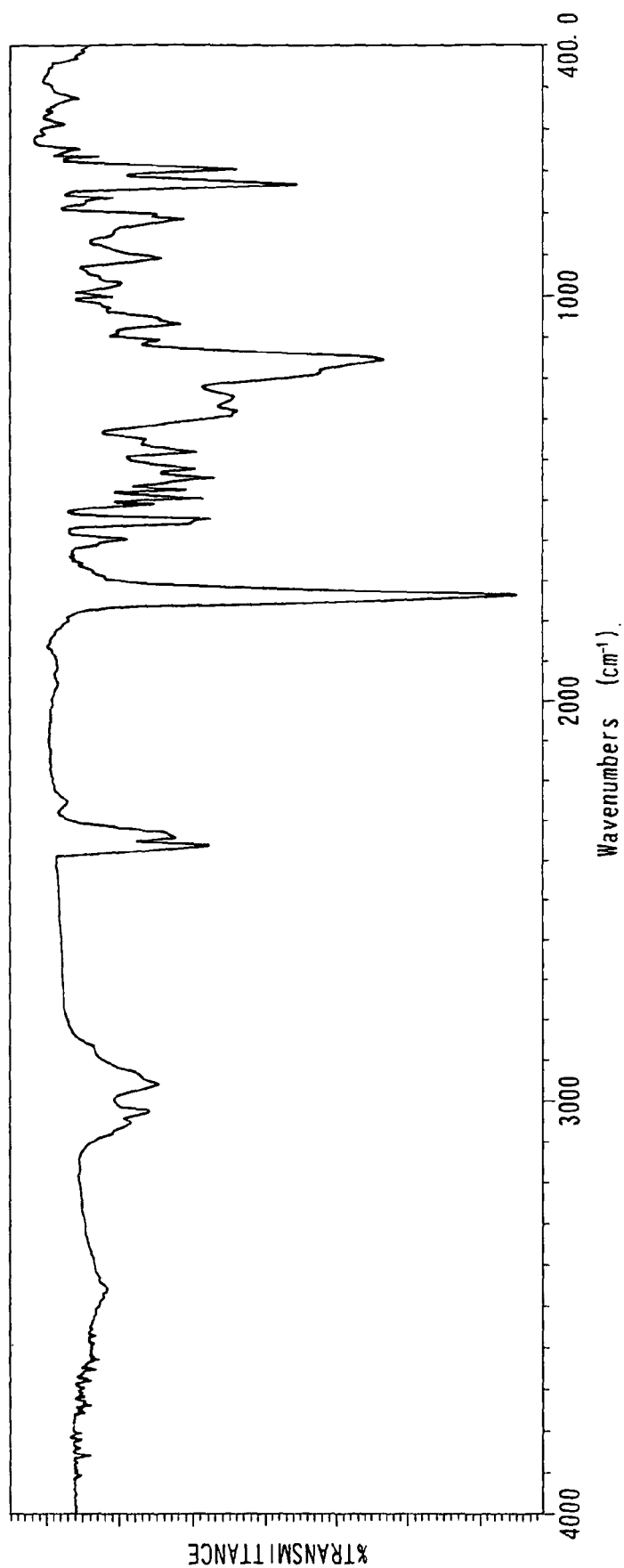
FIG. 9 is a chart showing the IR spectrum of a still another polyester resin according to the invention.
Figure 10:
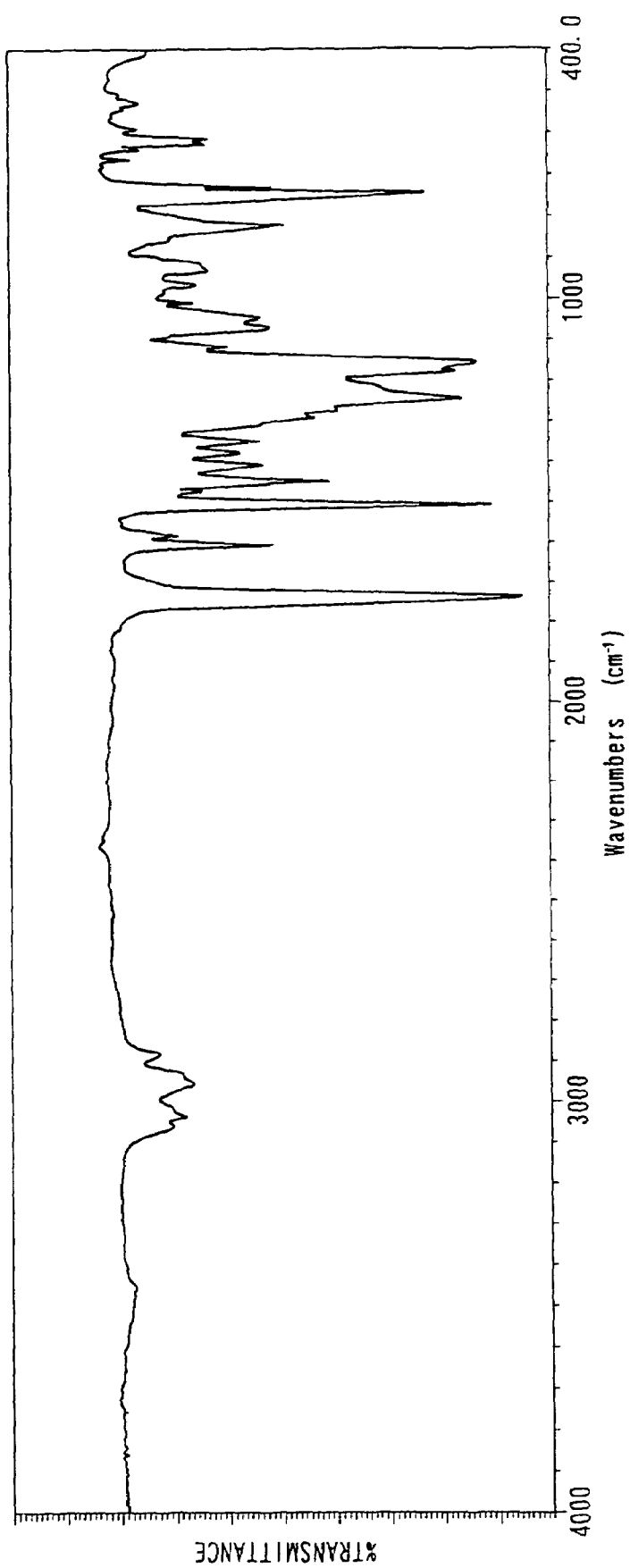
FIG. 10 is a chart showing the IR spectrum of a still another polyester resin according to the invention.
Figure 11:
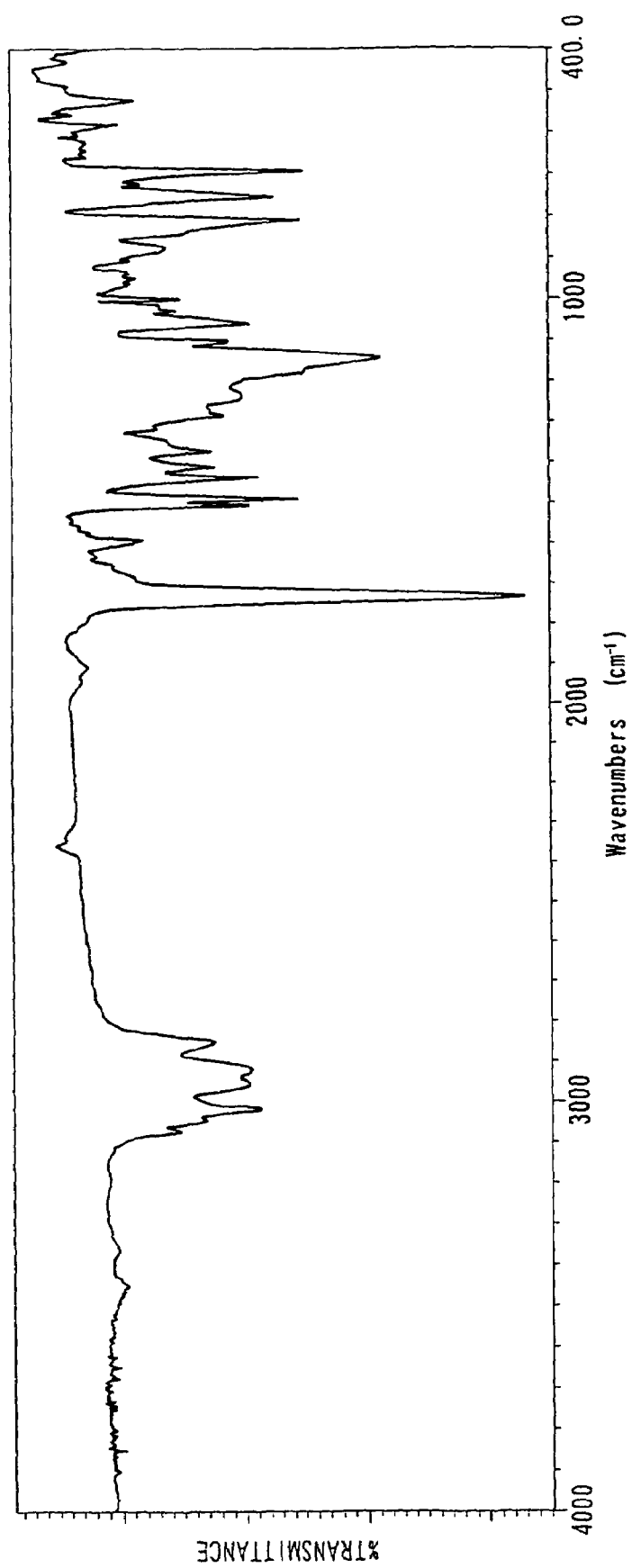
FIG. 11 is a chart showing the IR spectrum of a still another polyester resin according to the invention.

The weight average molecular weight (Mw) of polyester resin (P-7) is measured and found to be $7.2 \times 10^4$ (in terms of styrene). The resulting polyester resin (P-7) has an IR spectrum as shown in FIG. 8.

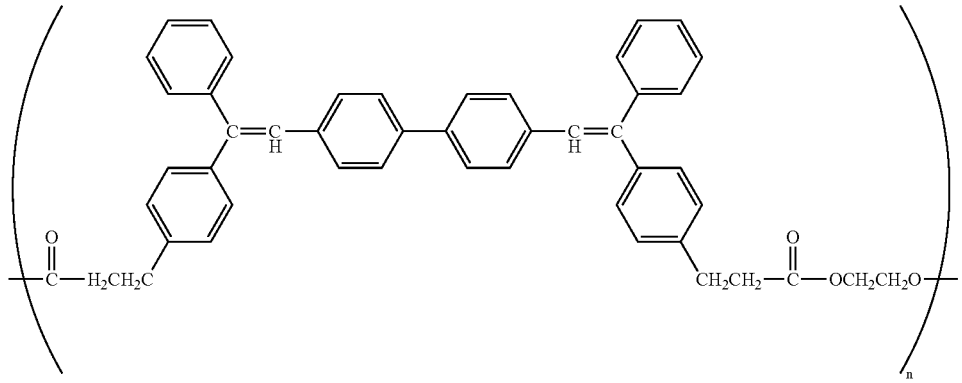

P-7

Example 1

A glass substrate with an ITO electrode etched into the shape of a strip having a width of 2 mm is washed with 2-propanol (electronics industry grade, manufactured by Kanto Kagaku) by ultrasonic cleaning and then dried. A hole transport layer of the hole transport material corresponding to the following compound (I) which hole transport layer has a thickness of 0.050 μm is formed on the surface of the substrate, and a light emitting layer of the luminescent material corresponding to the following compound (II) which light emitting layer has a thickness of 0.065 μm is formed on the surface of the hole transport layer, sequentially by vacuum evaporation.

Thereafter, polyester rein (P-1) obtained in Synthesis Example 1 is dissolved in methylene chloride so that a concentration thereof is 5% by mass. The resulting solution is filtered with a polytetrafluoroethylene (PTFE) filter having a pore size of 0.1 μm. The filtrate is applied onto the surface of the light emitting layer by a spin coater method so that an electron transport layer having a thickness of 0.050 μm is formed. A Mg—Ag alloy is finally deposited on the surface of the electron transport layer by vapor codeposition to form a back-side electrode having a width of 2 mm and a thickness of 0.15 μm and intersecting with the ITO electrode in the plan figure. A multilayer organic EL device is thus obtained. The resulting organic EL device has an effective area of 0.04 cm².

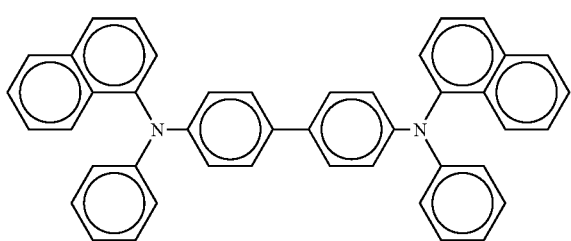

(I)

-continued

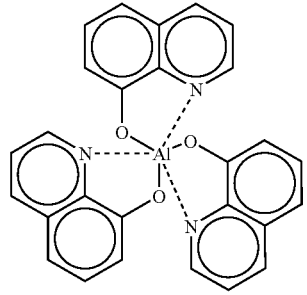

(II)

The organic EL device as prepared above is subjected to light emission measurement in which a DC voltage of 9.8 V is applied between the ITO electrode (plus) and the Mg—Ag back-side electrode (minus) in a vacuum state (0.13 Pa) in order to evaluate maximum brightness and emitted light color of the device. The results are shown in Table 25.

The light emission life of the organic EL device is also measured in dry nitrogen. In evaluation of the light emission life, a current value is set so as to provide an initial brightness of 50 cd/m², and the time period from a time when application of the voltage is initiated to a time when the brightness has been reduced to half of the initial value under constant current drive conditions is determined as the life (hours) of device. The driving current density and the device life measured are also shown in Table 25. The coating film in the organic EL device is visually even with no irregular portion observed.

Example 2

The multilayer organic EL device is prepared in the same manner as in Example 1 except that polyester resin (P-2) obtained in Synthesis Example 2 is used in place of polyester resin (P-1). The same evaluation is conducted and the results are shown in Table 25.

Example 3

The multilayer organic EL device is prepared in the same manner as in Example 1 except that polyester resin (P-5) obtained in Synthesis Example 5 is used in place of polyester resin (P-1). The same evaluation is conducted and the results are shown in Table 25.

Example 4

A liquid dispersion is prepared by adding compound (II) as shown above to a 1 mass % methylene chloride solution of polyester resin (P-7) obtained in Synthesis Example 7 in such a manner that the content of compound (II) is 0.5% by mass based on polyester resin (P-7) and dispersing them with a sand mill and glass beads having a diameter of 1 mm for 2 hours.

The multilayer organic EL device is prepared as in Example 1 except that the resulting solution is used to form a light emitting layer having a thickness of 0.06 μm in place of the light emitting layer used in Example 1. The same evaluation is conducted and the results are shown in Table 25.

Comparative Example 1

A glass substrate with an ITO electrode etched into the shape of a strip having a width of 2 mm is washed with 2-propanol (electronics industry grade, manufactured by Kanto Kagaku) by ultrasonic cleaning and then dried. A hole transport layer of the hole transport material corresponding to compound (I) described above which hole transport layer has a thickness of 0.050 μm is formed on the surface of the substrate, and a light emitting layer of the luminescent material corresponding to compound (II) above which light emitting layer has a thickness of 0.065 μm is formed on the surface of the hole transport layer, sequentially by vacuum evaporation.

Thereafter, an electron transport layer of compound (III) as shown below having a thickness of 0.050 μm is formed by vacuum evaporation. A Mg—Ag alloy is finally deposited on the surface of the electron transport layer by vapor codeposition to form a back-side electrode having a width of 2 mm and a thickness of 0.15 μm and intersecting with the ITO electrode in the plane figure. A multilayer organic EL device is thus prepared. The resulting organic EL device has an effective area of 0.04 cm².

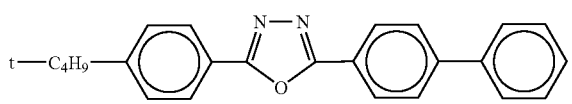

(III)

The resulting organic EL device is evaluated in the same manner as in Example 1.

The results are shown in Table 25.

Comparative Example 2

The multilayer organic EL device is prepared in the same manner as in Comparative Example 1 except that the above-described monomer A is used in place of compound (III). The same evaluation is conducted and the results are shown in Table 25.

Comparative Example 3

The multilayer organic EL device is prepared in the same manner as in Comparative Example 1 except that the step of forming the electron transport layer is omitted. The same evaluation is conducted and the results are shown in Table 25.

Example 5

A 10 mass % dichloroethane dispersion liquid is prepared through the step of mixing 3 parts by mass of polyester compound (P-3) obtained in Synthesis Example 3 and 1 part by mass of the luminescent material corresponding to compound (II) described above. The dispersion is subjected to a dispersion process with a sand mill and glass beads having a diameter of 1 mm for 2 hours and then filtered with a PTFE filter having a pore size of 0.1 μm.

The filtrate is applied onto a glass substrate with an ITO electrode etched into the shape of a strip having a width of 2 mm by a spin coater method so that a light emitting layer having a carrier transport function and having a thickness of 0.15 μm is formed. After a thorough drying step, a Mg—Ag alloy is deposited by vapor codeposition to form a back-side electrode having a width of 2 mm and a thickness of 0.15 μm and intersecting with the ITO electrode when viewed from the upper side. As a result, a monolayer organic EL device is prepared. The resulting organic EL device has an effective area of 0.04 cm².

The resulting organic EL device is evaluated in the same manner as in Example 1. The results are shown in Table 25.

Example 6

A monolayer organic EL device is prepared in the same manner as in Example 5 except that polyester resin (P-4) obtained in Synthesis Example 4 is used in place of polyester resin (P-3). The same evaluation is conducted and the results are shown in Table 25.

Example 7

A monolayer organic EL device is prepared in the same manner as in Example 5 except that 2 parts by mass of polyester compound (P-1) obtained in Synthesis Example 1 and 1 part by mass of polyvinylcarbazole (PVK) are used in place of 3 parts by mass of polyester resin (P-3). The same evaluation is conducted and the results are shown in Table 25.

Example 8

A monolayer organic EL device is prepared in the same manner as in Example 5 except that 0.5 parts by mass of polyester compound (P-6) obtained in Synthesis Example 6 is added to the solution of the mixture of polyester resin (P-3) and compound (II). The same evaluation is conducted and the results are shown in Table 25.

Comparative Example 4

A monolayer organic EL device is prepared in the same manner as in Example 5 except that 2 parts by mass of polyvinylcarbazole (PVK) as a hole transport material and 1 part by mass of compound (III) as an electron transport material are used in place of 3 parts by mass of polyester compound (P-3). The same evaluation is conducted and the results are shown in Table 25.

Comparative Example 5

A monolayer organic EL device is prepared in the same manner as in Comparative Example 4 except that the electron transport material of compound (III) is not used. The same evaluation is conducted and the results are shown in Table 25.

TABLE 25

|  | Maximum Brightness ($cd/m^2$) | Color of Emitted Light | Driving Current Density ($mA/cm^2$) | Life of Device (hours) |
|---|---|---|---|---|
| Example 1 | 1500 | Green | 7.5 | 34 |
| Example 2 | 1100 | Green | 7.8 | 32 |
| Example 3 | 1760 | Green | 7.4 | 32 |
| Example 4 | 1440 | Green | 8.0 | 40 |
| Comparative Example 1 | 1380 | Green | 8.5 | 13 |
| Comparative Example 2 | 1100 | Green | 8.8 | 17 |
| Comparative Example 3 | 1180 | Green | 8.5 | 19 |
| Example 5 | 1400 | Green | 8.6 | 32 |
| Example 6 | 1200 | Green | 8.7 | 28 |
| Example 7 | 1050 | Green | 8.9 | 26 |
| Example 8 | 1100 | Green | 8.8 | 22 |
| Comparative Example 4 | 950 | Green | 9.6 | 10 |
| Comparative Example 5 | 850 | Green | 9.8 | 15 |

In each of the organic EL devices prepared in Examples, no unevenness is observed in the coating film, and a high brightness and a long device life are achieved. In each of the organic EL devices prepared in Comparative Examples, the brightness is low, and the device life is short. In Comparative Example 4, the coating film is particularly poor in evenness.

What is claimed is:

1. A copolymerized polyester resin comprising: at least one repeating unit represented by the following formula (1); and at least one repeating unit represented by the following formula (2);

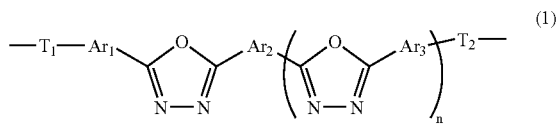
(1)

wherein $Ar_1$, $Ar_2$ and $Ar_3$ independently represent a substituted or unsubstituted arylene group, a substituted or unsubstituted bivalent heterocyclic group, or a combination thereof; $T_1$ and $T_2$ represent a linear or branched bivalent hydrocarbon group having 1 to 10 carbon atoms; and n represents 0 or 1,

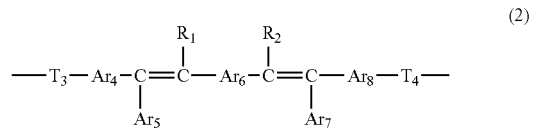
(2)

wherein $Ar_4$, $Ar_6$ and $Ar_8$ independently represent a substituted or unsubstituted arylene group, a substituted or unsubstituted bivalent heterocyclic group, or a combination thereof; $Ar_5$ and $Ar_7$ independently represent a substituted or unsubstituted aryl group or a substituted or unsubstituted heterocyclic group; $R_1$ and $R_2$ independently represent a hydrogen atom, a cyano group, an alkyl group, an alkoxy group, an alkylthio group, an aryloxy group, an arylthio group, or a heterocyclic group; and $T_3$ and $T_4$ represent a linear or branched bivalent hydrocarbon group having 1 to 10 carbon atoms.

2. A copolymerized polyester resin comprising: at least one of a repeating unit represented by the following formula (1) and a repeating unit represented by the following formula (2); and a portion having an electron transport function;

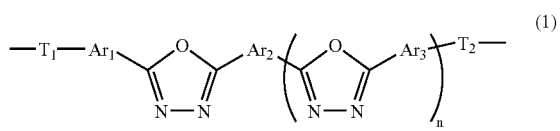
(1)

wherein $Ar_1$, $Ar_2$ and $Ar_3$ independently represent a substituted or unsubstituted arylene group, a substituted or unsubstituted bivalent heterocyclic group, or a combination thereof; $T_1$ and $T_2$ represent a linear or branched bivalent hydrocarbon group having 1 to 10 carbon atoms; and n represents 0 or 1,

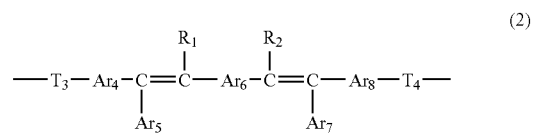
(2)

wherein $Ar_4$, $Ar_6$ and $Ar_8$ independently represent a substituted or unsubstituted arylene group, a substituted or unsubstituted bivalent heterocyclic group, or a combination thereof; $Ar_5$ and $Ar_7$ independently represent a substituted or unsubstituted aryl group or a substituted or unsubstituted heterocyclic group; $R_1$ and $R_2$ independently represent a hydrogen atom, a cyano group, an alkyl group, an alkoxy group, an alkylthio group, an aryloxy group, an arylthio group, or a heterocyclic group; and $T_3$ and $T_4$ represent a linear or branched bivalent hydrocarbon group having 1 to 10 carbon atoms, and wherein the portion having the electron transport function excludes the repeating unit represented by formula (1).

3. A copolymerized polyester resin comprising: at least one of a repeating unit represented by the following formula (1) and a repeating unit represented by the following formula (2); and a portion having a hole transport function;

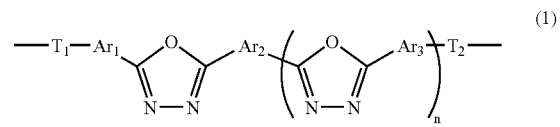
(1)

wherein $Ar_1$, $Ar_2$ and $Ar_3$ independently represent a substituted or unsubstituted arylene group, a substituted or unsubstituted bivalent heterocyclic group, or a combination thereof; $T_1$ and $T_2$ represent a linear or branched bivalent hydrocarbon group having 1 to 10 carbon atoms; and n represents 0 or 1,

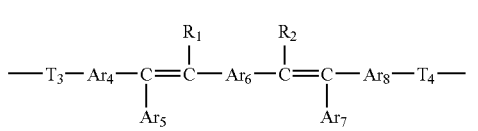

(2)

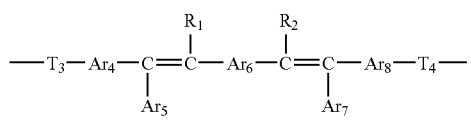

(2)

wherein $Ar_4$, $Ar_6$ and $Ar_8$ independently represent a substituted or unsubstituted arylene group, a substituted or unsubstituted bivalent heterocyclic group, or a combination thereof; $Ar_5$ and $Ar_7$ independently represent a substituted or unsubstituted aryl group or a substituted or unsubstituted heterocyclic group; $R_1$ and $R_2$ independently represent a hydrogen atom, a cyano group, an alkyl group, an alkoxy group, an alkylthio group, an aryloxy group, an arylthio group, or a heterocyclic group; and $T_3$ and $T_4$ represent a linear or branched bivalent hydrocarbon group having 1 to 10 carbon atoms, and wherein the portion having the hole transport function excludes the repeating unit represented by formula (2).

4. A copolymerized polyester resin comprising: at least one of a repeating unit represented by the following formula (1) and a repeating unit represented by the following formula (2); and a portion having a light emitting function;

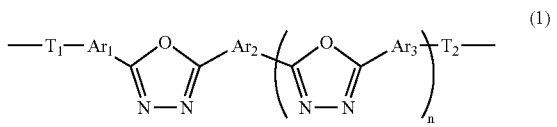

(1)

wherein $Ar_1$, $Ar_2$ and $Ar_3$ independently represent a substituted or unsubstituted arylene group, a substituted or unsubstituted bivalent heterocyclic group, or a combination thereof; $T_1$ and $T_2$ represent a linear or branched bivalent hydrocarbon group having 1 to 10 carbon atoms; and n represents 0 or 1, wherein $Ar_4$, $Ar_6$ and $Ar_8$ independently represent a substituted or unsubstituted arylene group, a substituted or unsubstituted bivalent heterocyclic group, or a combination thereof; $Ar_5$ and $Ar_7$ independently represent a substituted or unsubstituted aryl group or a substituted or unsubstituted heterocyclic group; $R_1$ and $R_2$ independently represent a hydrogen atom, a cyano group, an alkyl group, an alkoxy group, an alkylthio group, an aryloxy group, an arylthio group, or a heterocyclic group; and $T_3$ and $T_4$ represent a linear or branched bivalent hydrocarbon group having 1 to 10 carbon atoms, and wherein the portion having the light emitting function excludes the repeating unit represented by formula (2).

5. A functional device comprising at least one kind of the polyester resin of claim 1.

6. An organic electroluminescent device comprising: a pair of electrodes composed of an anode and a cathode, at least one of which is transparent or translucent; and at least one organic compound layer that is sandwiched between the electrodes and contains at least one kind of the polyester resin of claim 1.

7. The copolymerized polyester resin of claim 3, wherein the portion having the hole transport function is an arylamine derivative.

8. A method of manufacturing an organic electroluminescent device, the method comprising the steps of: forming at least one organic compound layer on a surface of an electrode; and forming a counter electrode on a surface of the at least one organic compound layer, wherein at least one kind of the polyester resin according to claim 1 is used to form at least one layer of the at least one organic compound layer in the step of forming the at least one organic compound layer.

* * * * *